(12) United States Patent
Forbes

(10) Patent No.: US 7,312,626 B2
(45) Date of Patent: Dec. 25, 2007

(54) CMOS CIRCUITS WITH REDUCED CROWBAR CURRENT

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 118 days.

(21) Appl. No.: 11/216,199

(22) Filed: Aug. 31, 2005

(65) Prior Publication Data
US 2007/0046330 A1 Mar. 1, 2007

(51) Int. Cl.
*H03K 19/003* (2006.01)
(52) U.S. Cl. .......................... 326/26; 326/31; 327/170
(58) Field of Classification Search ............ 326/26–27, 326/29, 31
See application file for complete search history.

(56) References Cited

U.S. PATENT DOCUMENTS

| | | | |
|---|---|---|---|
| 4,845,385 A | 7/1989 | Ruth, Jr. | |
| 5,165,046 A | 11/1992 | Hesson | |
| 5,173,622 A * | 12/1992 | Maemura | 326/115 |
| 5,296,766 A | 3/1994 | Masaki | |
| 5,438,278 A | 8/1995 | Wong | |
| 5,473,269 A | 12/1995 | Dickinson | |
| 5,751,180 A | 5/1998 | D'Addeo | |
| 6,051,995 A | 4/2000 | Pollachek | |
| 6,222,175 B1 | 4/2001 | Krymski | |
| 6,236,248 B1 * | 5/2001 | Koga | 327/112 |
| 6,265,896 B1 | 7/2001 | Podlesny et al. | |
| 6,373,290 B1 | 4/2002 | Forbes | |
| 6,388,470 B1 | 5/2002 | Mattos | |
| 6,445,258 B1 | 9/2002 | Truong | |
| 6,452,441 B1 | 9/2002 | Kim | |
| 6,462,929 B2 | 10/2002 | Compton | |
| 6,466,063 B2 | 10/2002 | Chen | |
| 6,559,676 B1 * | 5/2003 | Tomita | 326/81 |
| 6,563,345 B2 | 5/2003 | Forbes | |
| 6,606,271 B2 | 8/2003 | Hunt | |
| 6,649,476 B2 | 11/2003 | Forbes | |
| 6,720,803 B2 | 4/2004 | Pihlstrom | |

OTHER PUBLICATIONS

Crowley, Matthew, et al., "512 Mb PROM with 8 Layers of Antifuse/Diode Cells", *IEEE International Solid-State Circuits Conference 2003 Digest of Papers*, (Feb. 11, 2003), 284-293.

(Continued)

*Primary Examiner*—James H. Cho
(74) *Attorney, Agent, or Firm*—Schwegman, Lundberg & Woessner, P.A.

(57) ABSTRACT

Various circuit embodiments comprise an input node to receive an input signal for a CMOS transistor stack, a first output node to deliver the input signal to a PMOS pull-up transistor of the CMOS transistor stack, and a second output node to deliver the input signal to an NMOS pull-down transistor of the CMOS transistor stack. A first passive signal path between the input node and the first output node is adapted to pass an effective rising edge of the input signal and delay an effective falling edge of the input signal to a gate of the PMOS transistor. A second passive signal path between the input node and the second output node is adapted to delay the effective rising edge of the input signal and pass the effective falling edge of the input signal to a gate of the NMOS transistor. Other aspects and embodiments are provided herein.

39 Claims, 15 Drawing Sheets

OTHER PUBLICATIONS

Frenkil, Jerry, "A multi-level approach to low-power IC design", *IEEE Spectrum*, vol. 35, No. 2, (Feb. 1998), 13 pages.

Herner, S. B., et al., "Vertical p-i-n Polysilicon Diode with Antifuse for Stackable Field-Programmable ROM", *IEEE Electron Device Letters*, vol. 25, No. 5, (May 2004), 271-273.

Johnson, Mark, et al., "512-Mb PROM with a Three-Dimensional Array of Diode/Antifuse Memory Cells", *IEEE Journal of Solid-State Circuits*, vol. 38, No. 11, (Nov. 2003), 1920-1928.

Li, Feng, et al., "Evaluation of SiO2 Antifuse in a 3D-OTP Memory", *IEEE Transactions on Device and Materials Reliability*, vol. 4, No. 3, (Sep. 2004), 416-421.

Naffziger, Samuel, et al., "The Implementation of a 2-core Multi-Threaded Itanium-Family Processor", *IEEE International Solid-State Circuits Conference 2005 Digest of Papers*, Session 10,(2005), 182-183, no month.

* cited by examiner

_US 7,312,626 B2_

CMOS CIRCUITS WITH REDUCED CROWBAR CURRENT

TECHNICAL FIELD

This disclosure relates generally to integrated circuits, and more particularly, to systems, devices and methods to reduce power consumption in semiconductor circuits.

BACKGROUND

Power consumption is becoming a limiting factor in integrated circuits and in particular microprocessors. Currently, some microprocessors can operate at around 100 Watts, which is around the practical limit for simple air cooling. Much of the power dissipation is due to clock drivers, interconnection drivers, and output drivers of complementary metal oxide semiconductor (CMOS) inverters that are required to drive large capacitive loads at high switching speeds. In order to drive large capacitive loads, these drivers include wide devices with large channel width-to-length (W/L) ratios. These drivers have a relatively slow rise time because of the large capacitive loads, such that the rise and fall times of the input and output waveforms are a significant part of the overall period of the waveforms.

An integrated circuit consumes static and dynamic power. Static power refers to the product of the supply voltage and the direct current (DC), including both through current and leakage current. Dynamic power consumption includes capacitive power consumption, which refers to the product of the load capacitance, the square of the supply voltage and the toggle frequency. Low-power designs can include designs to avoid circuits that consume static power, designs to reduce the supply voltage which can have the undesirable effects of lowering transistor output currents and increasing signal delays, designs to reduce capacitance, and designs to reduce signal frequencies. Increased signal delays and lower signal frequencies are undesirable for fast processor and memory operations.

Dynamic power consumption also includes power dissipation from momentary short circuits, referred to as crowbar currents, that occur when a transistor stack switches states and both the p-channel metal oxide semiconductor (PMOS) and n-channel metal oxide semiconductor (NMOS) transistors are temporarily conducting current. Thus, during the switching transient of a CMOS inverter there can be a large DC current, or "crowbar" current down through both the PMOS device and NMOS device when the output is around one half of the power supply voltage. This current does not contribute to switching the capacitive loads and constitutes wasted power.

SUMMARY

One aspect of this disclosure relates to a circuit. Various circuit embodiments comprise an input node to receive an input signal for a CMOS transistor stack, a first output node to deliver the input signal to a PMOS pull-up transistor of the CMOS transistor stack, and a second output node to deliver the input signal to an NMOS pull-down transistor of the CMOS transistor stack. A first passive signal path between the input node and the first output node is adapted to pass an effective rising edge of the input signal and delay an effective falling edge of the input signal to a gate of the PMOS transistor. A second passive signal path between the input node and the second output node is adapted to delay the effective rising edge of the input signal and pass the effective falling edge of the input signal to a gate of the NMOS transistor.

Various circuit embodiments comprise an input node to receive an input signal for a CMOS transistor stack, a first output node to deliver the input signal to a gate of a PMOS pull-up transistor of the CMOS transistor stack, and a second output node to deliver the input signal to a gate of an NMOS pull-down transistor of the CMOS transistor stack. The PMOS transistor has a PMOS threshold voltage below which the PMOS transistor does not conduct, and at which the PMOS transistor begins to conduct and continues to conduct at potentials greater than the PMOS threshold voltage. The NMOS transistor has an NMOS threshold voltage below which the NMOS transistor does not conduct, and at which the NMOS transistor begins to conduct and continues to conduct at potentials greater than the NMOS threshold voltage. The circuit further comprises a first passive signal path between the input node and the first output node and a second passive signal path between the input node and the second output node. The second passive signal path is adapted to delay the rising edge of the input signal from crossing the NMOS threshold voltage until after the PMOS threshold voltage is crossed, and the first passive signal path is adapted to delay the falling edge of the input signal from crossing the PMOS threshold voltage until after the NMOS threshold voltage is crossed.

Various circuit embodiments comprise an input node to receive an input signal for a CMOS transistor stack, a first output node to deliver the input signal to a gate of a PMOS pull-up transistor of the CMOS transistor stack, a first signal path between the input node and the first output node, a second output node to deliver the input signal to a gate of an NMOS pull-down transistor of the CMOS transistor stack, and a second signal path between the input node and the second output node. The first signal path is adapted to charge the gate of the PMOS transistor to a logic high potential at a first charging rate and discharge the gate of the PMOS transistor to a logic low potential at a first discharging rate. The second signal path is adapted to charge the gate of the NMOS transistor to a logic high potential at a second charging rate slower than the first charging rate and to discharge the gate of the NMOS transistor to a logic low potential at a second discharging rate faster than the first discharging rate.

Various circuit embodiments comprise an input node to receive an input signal for a CMOS transistor stack, a first output node to deliver the input signal to a PMOS pull-up transistor of the CMOS transistor stack, a second output node to deliver the input signal to an NMOS pull-down transistor of the CMOS transistor stack, a first diode, including an anode connected to the input node and a cathode connected to a gate of the PMOS transistor, and a second diode, including an anode connected to a gate of the NMOS transistor and a cathode connected to the input node.

One aspect of this disclosure relates to an integrated circuit structure. Various integrated circuit structure embodiments comprise a substrate, a PMOS transistor on the substrate where the PMOS transistor includes a p-type gate, an NMOS transistor on the substrate where the NMOS transistor including an N-type gate, a first diode with a p-type cathode integrated with the p-type gate and an n-type anode electrically connected to an input node, and a second diode with an n-type anode integrated with the n-type gate and a p-type cathode electrically connected to the input nodes. Some embodiments include horizontally-oriented diodes, and some embodiments include vertically-oriented diodes.

Other aspects and embodiments are provided herein. This summary is an overview of some of the teachings of the present application and is not intended to be an exclusive or exhaustive treatment of the present subject matter. Further details are found in the detailed description and appended claims. Other aspects will be apparent to persons skilled in the art upon reading and understanding the following detailed description and viewing the drawings that form a part thereof, each of which are not to be taken in a limiting sense. The scope of the present invention is defined by the appended claims and their legal equivalents.

DETAILED DESCRIPTION

Figure 1A:
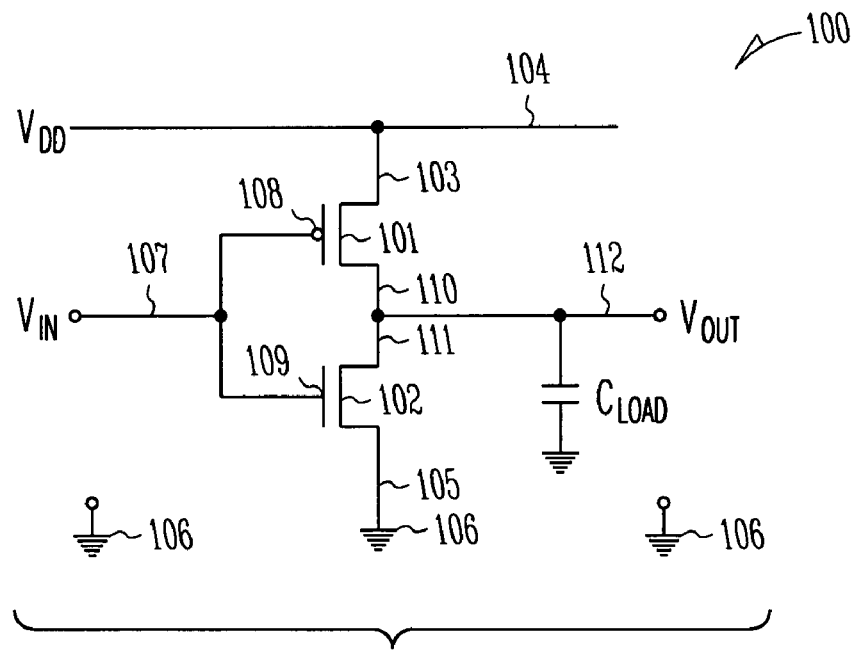
FIGS. 1A-1D illustrate the crowbar current associated with conventional CMOS inverters and drivers.

The following detailed description refers to the accompanying drawings which show, by way of illustration, specific aspects and embodiments in which the present invention may be practiced. The various embodiments are not necessarily mutually exclusive, as aspects of one embodiment can be combined with aspects of another embodiment. Other embodiments may be utilized and structural, logical, and electrical changes may be made without departing from the scope of the present invention. In the following description, the terms "wafer" and "substrate" are used interchangeably to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The terms "horizontal" and "vertical", as well as prepositions such as "on", "over" and "under" are used in relation to the conventional plane or surface of a wafer or substrate, regardless of the orientation of the wafer or substrate. References to "an", "one", or "various" embodiments in this disclosure are not necessarily to the same embodiment, and such references contemplate more than one embodiment. The following detailed description is, therefore, not to be taken in a limiting sense, and the scope of the present invention is defined only by the appended claims, along with the full scope of equivalents to which such claims are entitled.

Disclosed herein, among other things, is a technique to asymmetrically deliver rising and falling edges of input waveforms to the gates of a PMOS pull-up transistor and an NMOS pull-down transistor for a CMOS inverter to prevent, or significantly reduce, the direct current conducted between the power supply and ground through the transistor channels. On the rising edge of the input waveform, the conductance through the PMOS transistor is substantially reduced or eliminated first, and then the NMOS transistor turns on to discharge the capacitive load. In some embodiments, the PMOS transistor substantially turns off before the NMOS transistor turns on; and in some embodiments, the PMOS transistor completely turns off before the NMOS transistor turns on. On the falling edge of the input waveform, the conductance through the NMOS transistor is substantially reduced or eliminated first, and then the PMOS transistor turns on to charge the capacitive load. In some embodiments, the NMOS transistor substantially turns off before the PMOS transistor turns on; and in some embodiments, the NMOS transistor completely turns off before the PMOS transistor turns on.

Wasted Power from Crowbar Current in CMOS Inverters

FIGS. 1A-1D illustrate the crowbar current associated with conventional CMOS inverters and drivers. As discussed herein, the crowbar current flows through the transistor stack to ground without contributing to switching the capacitive loads. The present subject matter provides a circuit and method that reduces the crowbar current, and thus reduces wasted power in CMOS digital integrated circuits.

FIG. 1A shows a conventional CMOS inverter and driver such as can be used to drive interconnection lines, clock lines or output pads. The illustrated inverter 100 includes a transistor stack with a pull-up PMOS transistor 101 and a pull-down NMOS transistor 102. The source 103 of the illustrated PMOS transistor 101 is connected to a first reference potential 104 through a supply voltage line ($V_{DD}$), and the source 105 of the illustrated NMOS transistor 102 is connected to a second reference potential 106, illustrated as a ground potential. An input of the inverter 107 is connected to both the gate 108 of the PMOS transistor and the gate 109 of the NMOS transistor. A node connecting the drain 110 of the PMOS transistor and the drain 111 of the NMOS transistor provides the output of the inverter 112. The capacitive load being driven by the driver is also illustrated by capacitor $C_{LOAD}$ connected between the inverter output 112 and ground 106.

Figure 1B:
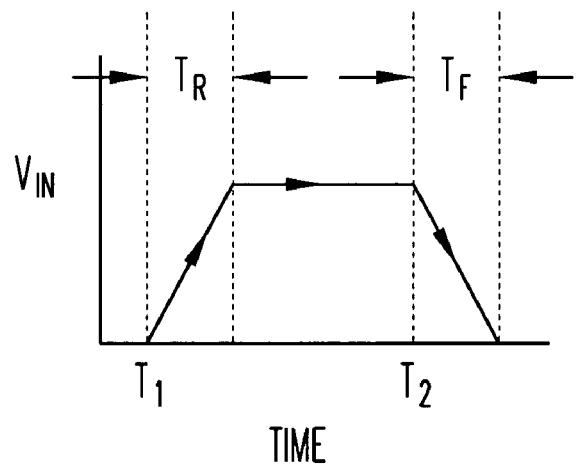

FIG. 1B illustrates an input waveform $V_{IN}$ transmitted to the inverter input. The digital input waveform $V_{IN}$ has a finite rise time $T_R$ and fall time $T_F$ that are a significant part of the overall period of the input waveform $V_{IN}$. The illustrated input waveform $V_{IN}$ is at a low logic level at time $T_1$ and rises during the rise time $T_R$ to a high logic level. The illustrated input waveform $V_{IN}$ remains at the high logic level until time $T_2$, when it falls during the fall time $T_F$ back to the low logic level. When the input waveform $V_{IN}$ is at the logic low potential, the NMOS transistor does not conduct and the PMOS transistor conducts to charge the capacitive load, pulling a potential at the inverter output up to a logic high potential. When the input waveform $V_{IN}$ is at the logic high potential, the PMOS transistor does not conduct and the NMOS transistor conducts to discharge the capacitive load, pulling the potential at the inverter output down to a logic low potential. However, when the input waveform $V_{IN}$ transitions from the logic low potential to the logic high potential and from the logic high potential to the logic low potential, there is a time where both the PMOS and NMOS transistors can conduct current, which is referred to as crowbar current.

Figure 1C:
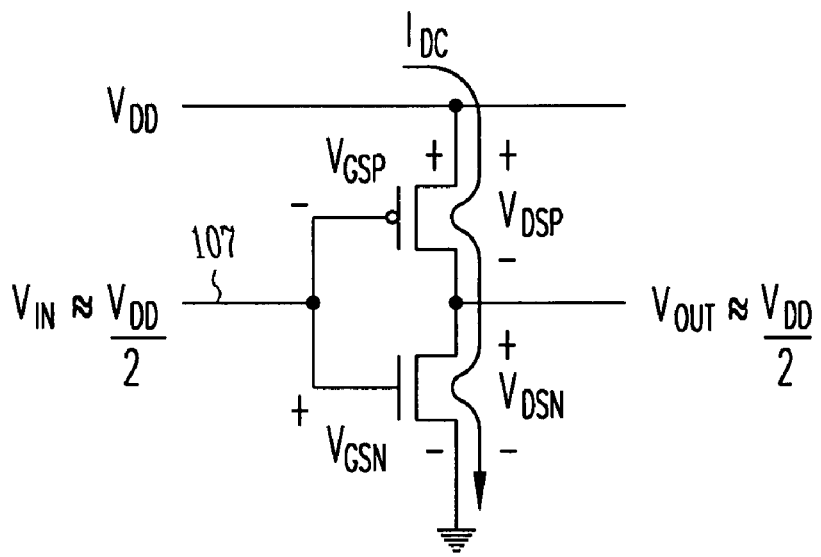

FIG. 1C illustrates current flow through the inverter when the potential at the inverter input and the potential at the inverter output are approximately half the potential of that on the supply voltage line ($V_{DD}$). The gate to source potential ($V_{GSP}$) of the PMOS transistor is sufficient to allow the PMOS transistor to conduct, and the gate to source potential ($V_{GSN}$) of the NMOS transistor is sufficient to allow the NMOS transistor to conduct. Since the PMOS and NMOS transistors are both conducting, a large DC current $I_{DC}$ can flow from $V_{DD}$ through the transistor stack of the inverter to ground. This large DC current flow is wasted energy as it is not used to charge the capacitive load.

Figure 1D:
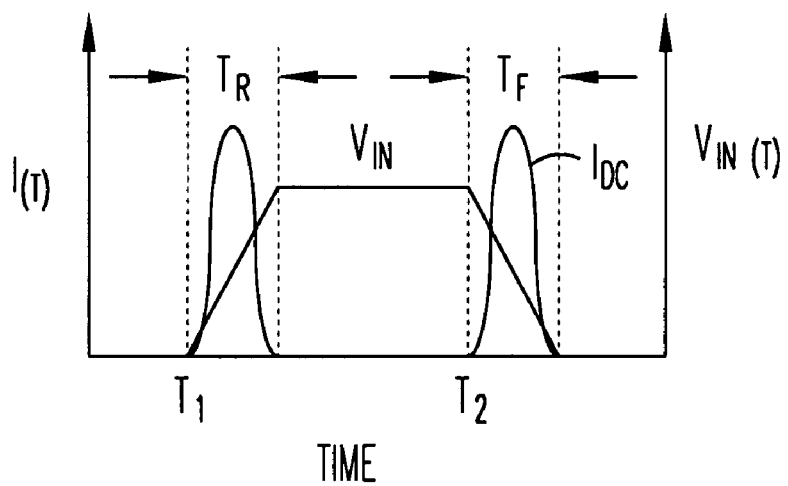

FIG. 1D illustrates both the potential of the input waveform $V_{IN}(T)$, such as illustrated in FIG. 1B, and the DC crowbar current $I(T)$ through the transistor stack over time. The illustrated input waveform $V_{IN}$ is at a low logic level at time $T_1$ rises during the rise time $T_R$ to a high logic level, remains at the high logic level until time $T_2$, and falls during the fall time $T_F$ back to the low logic level. As illustrated in the figure, large peak values of DC crowbar current $I_{DC}$ can occur on both the rising and falling edge of the input waveform $V_{IN}$. This DC crowbar current does not contribute to switching the capacitive loads and constitutes wasted power.

CMOS Circuits with Reduced or Eliminated Crowbar Current

The present subject matter reduces or eliminates the DC crowbar current during logic transitions in a CMOS inverter, and thus reduces wasted power in digital integrated circuits. The present subject matter selectively adjusts the rising and falling edges of the input signal to reduce conduction through a channel of one transistor in the transistor stack before increasing conduction through a channel of the other transistor in the transistor stack. In some embodiments, the timing of the rising and the timing of the falling edges of the input signal are selectively adjusted to substantially prevent conduction through a channel of one transistor in the transistor stack before increasing conduction through a channel of the other transistor in the transistor stack. In some embodiments, the timing of the rising and falling edges allows both transistors to simultaneously conduct, but substantially reduces current through a channel of one transistor before increasing conduction through a channel of the other transistor so that the DC crowbar current is significantly reduced. A rising edge, low-to-high transition in the input signal will result in a discharging current flowing from the inverter output through the NMOS pull-down transistor to ground to cause the inverter output to have a logic low potential. In response to the low-to-high transition, the present subject matter passes the low-to-high input transition to the PMOS pull-up transistor and delays the low-to-high input transition to the NMOS pull-down transistor such that conduction through the PMOS transistor is reduced or substantially prevented before the NMOS transistor begins to conduct. A falling edge, high-to-low transition in an input signal will result in a charging current flowing from the power supply line $V_{DD}$ through the PMOS pull-up transistor to charge the inverter output to a logic high potential. In response to the high-to-low transition, the present subject matter passes the high-to-low input transition to the NMOS pull-down transistor and delays the high-to-low input transition to the PMOS pull-up transistor such that conduction through the NMOS transistor is reduced or substantially prevented before the PMOS transistor begins to conduct.

Figure 2:
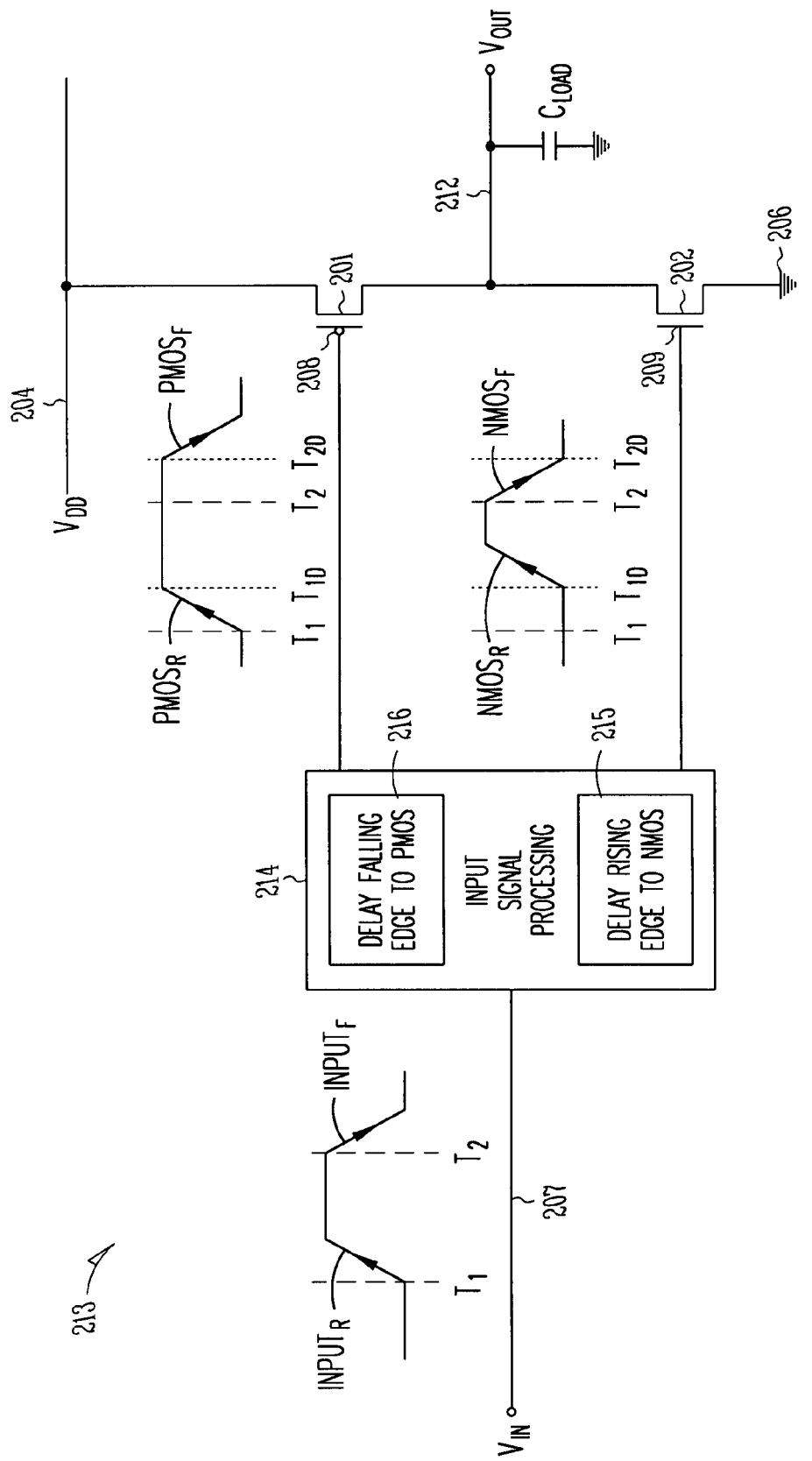
FIG. 2 illustrates a CMOS circuit with reduced crowbar current, according to various embodiments.

FIG. 2 illustrates a CMOS circuit with reduced crowbar current, according to various embodiments. The illustrated circuit 213 includes a transistor stack connected between a first reference potential ($V_{DD}$) 204 and a second reference potential (GND) 206. The transistor stack includes a PMOS transistor 201 connected to the first reference potential and an NMOS transistor 202 connected to the second reference potential. An inverter output 212 is connected to a drain node of the PMOS transistor and a drain node of the NMOS transistor, and a load capacitance ($C_{LOAD}$) is connected between the inverter output 212 and the second reference potential 206. The illustrated CMOS circuit also includes an input signal processing module 214 connected between an inverter input 207 and the gates 208 and 209 of the PMOS and NMOS transistors 201 and 202. As illustrated in the figure, an input signal with a rising edge ($INPUT_R$) beginning at time $T_1$ and a falling edge ($INPUT_F$) beginning at time $T_2$ is transmitted to the input signal processing module. The module includes circuitry 216 to pass the rising edge of the input signal ($INPUT_R$) to the gate of the PMOS transistor as rising edge ($PMOS_R$) at or nearly at time $T_1$, and circuitry 215 to delay the rising edge of the input signal (INPUT$_R$) to the gate of the NMOS transistor as rising edge (NMOS$_R$) at delayed time T$_{1D}$. The module 214 further includes circuitry 215 to pass the falling edge of the input signal (INPUT$_F$) to the gate of the NMOS transistor as falling edge (NMOS$_F$) at or nearly at time T$_2$, and circuitry 216 to delay the falling edge of the input signal (INPUT$_F$) to the gate of the PMOS transistor as falling edge (PMOS$_F$) at a delayed time T$_{2D}$. Embodiments of the circuitry 214 include a first passive signal path between the input 207 and the PMOS gate 208, and a second passive signal path between the input 207 and the NMOS gate 209.

The voltage waveforms illustrated at the gates of the PMOS and NMOS transistors are approximations to provide a simple model that illustrates that the response of the NMOS transistor to the rising edge of the input signal is delayed (the NMOS transistor does not conduct current as quickly because the input signal processing module delays or slows the increase in the NMOS gate potential), and that further illustrates that the response of the PMOS transistor to the falling edge of the input signal is delayed (the PMOS transistor does not conduct current as quickly because the input processing module delays or slows the decrease in the PMOS gate potential). In this simple model, the slopes of the rising and falling edges are illustrated to be the same at the inverter input 207 and at the gates 208 and 209 of the PMOS and NMOS transistors 201 and 202, and the delay is illustrated as a delay in beginning the potential transition. As discussed in more detail below with respect to embodiments that use diodes to provide the input signal processing function, the conduction of the NMOS and PMOS transistors can be delayed by reducing the magnitude of the slope of the potential transition at the transistor gate. The magnitude of the slope can be reduced by reducing current flow by decreasing conductance (increasing resistance) between the inverter input and the transistor gates.

Various embodiments disclosed herein use passive devices such as diodes to introduce an asymmetry into the input connections to the gates of the transistors. As will be described later, these diodes can be conveniently realized as part of the polysilicon gates of the transistors. The asymmetry provides a conduction path from the inverter input to each of the transistor gates with a resistance during a rising edge that is different from a resistance during a falling edge. The resistance of the conduction path to the NMOS transistor is greater than the resistance of the conduction path to the PMOS transistor during the rising edge of the input signal, and the resistance of the conduction path to the PMOS transistor is greater than the resistance of the conduction path to the NMOS transistor during a falling edge of the input signal.

Figure 3:
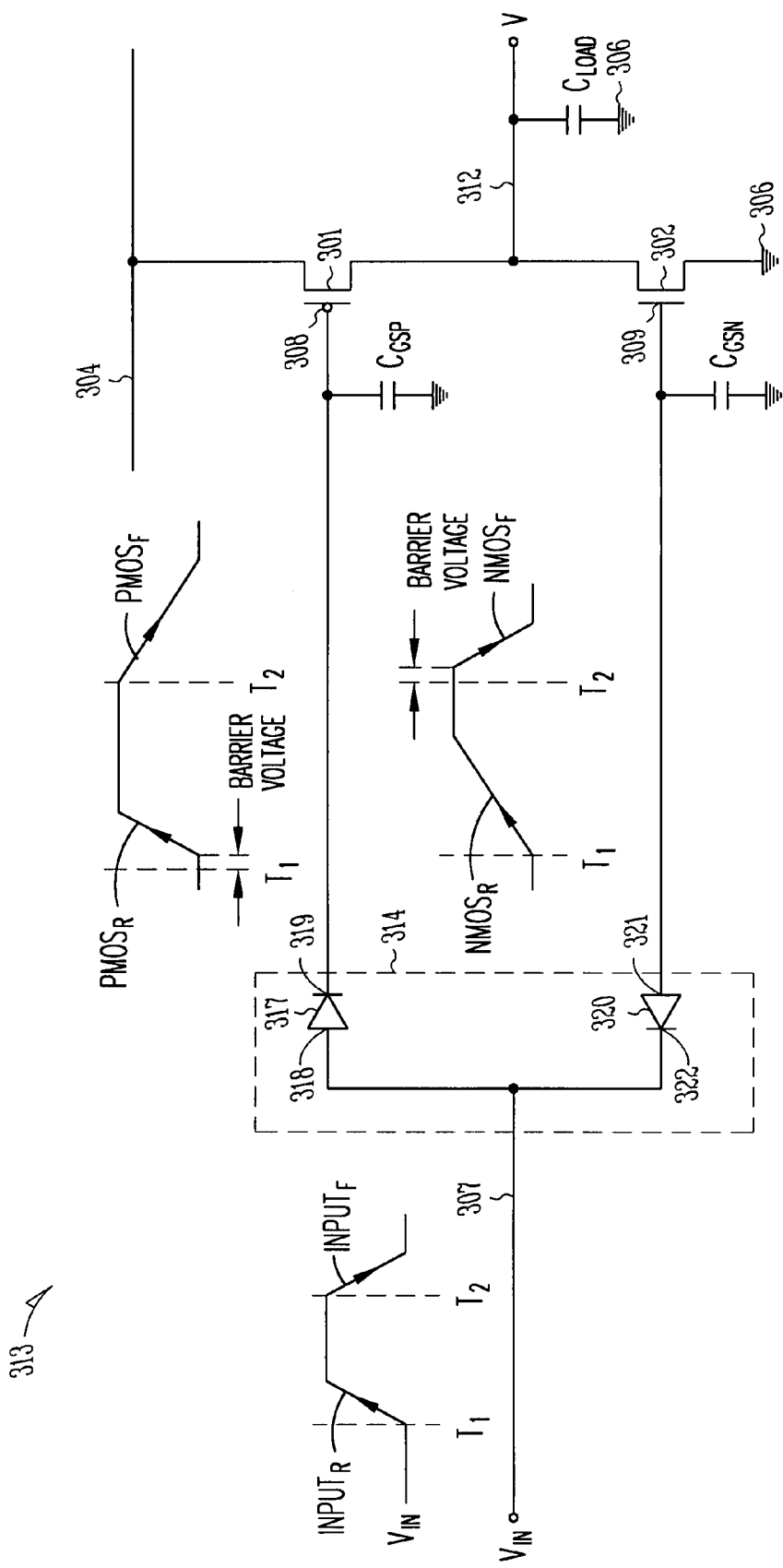
FIG. 3 illustrates a CMOS circuit with a diode connected between the inverter input node and the PMOS gate, and a diode connected between the inverter input node and NMOS gate, according to various embodiments.

FIG. 3 illustrates a CMOS circuit with a diode connected between the inverter input node and the PMOS gate and a diode connected between the inverter input node and NMOS gate, according to various embodiments. The illustrated circuit 313 includes a transistor stack connected between a first reference potential (V$_{DD}$) 304 and a second reference potential (GND) 306. The transistor stack includes a PMOS transistor 301 connected to the first reference potential and an NMOS transistor 302 connected to the second reference potential. An inverter output 312 is connected to a drain node of the PMOS transistor and a drain node of the NMOS transistor, and a load capacitance (C$_{LOAD}$) is connected between the inverter output 312 and the second reference potential 306. The capacitances associated with the PMOS gate (C$_{GSP}$) and the NMOS gate (C$_{GSN}$) are also illustrated. The illustrated CMOS circuit 313 also includes an input signal processing module 314 connected between an inverter input and the gates of the PMOS and NMOS transistors. The illustrated input signal processing module includes a first diode 317 with an anode 318 connected to the inverter input 307 and a cathode 319 connected to the PMOS gate 308. The module further includes a second diode 320 with an anode 321 connected to the NMOS gate 309 and a cathode 322 connected to the inverter input 307. The first diode 317 is forward-biased and the second diode 320 is reverse-biased during the rising edge of the input signal (INPUT$_R$), and the second diode 320 is forward-biased and the first diode 317 is reverse-biased during the falling edge of the input signal (INPUT$_F$).

Figure 4:
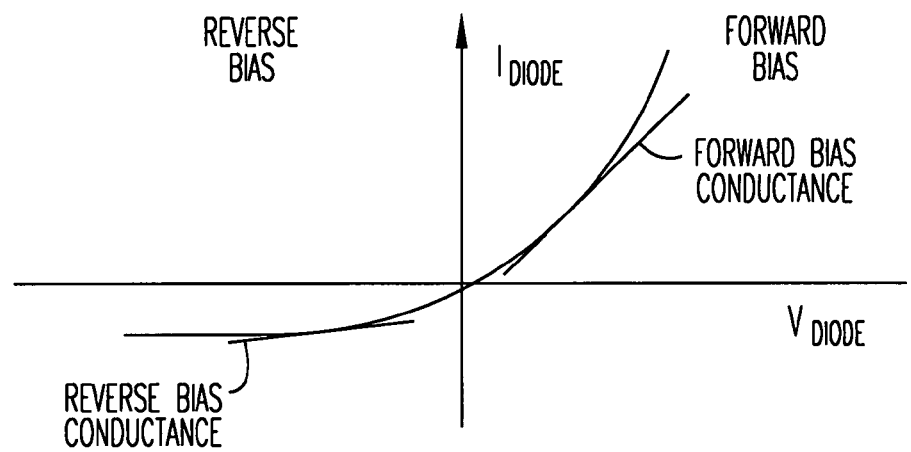
FIG. 4 shows a diode I-V characteristic and the diode conductances in forward and reverse bias.

FIG. 4 shows a diode I-V characteristic and the diode conductances in forward and reverse bias. The diodes are two-terminal, passive non-linear devices. The slope (I/V) of a tangential line for a point along the curve represents the conductance (G) of the diode at that point. The resistance of the diode is represented by the inverse of the conductance (R=1/G=V/I). The figure illustrates that a forward-biased diode is characterized by a high conductance and low resistance, and a reverse-biased diode is characterized by a low conductance and high resistance. As illustrated, the magnitude of the current corresponding a potential that forward biases the diode is greater than the magnitude of the current corresponding to a potential that reverse biases the diode. The reverse current for ideal diodes is equal to the saturation current. Real diodes have a reverse current that, although still very small, is much larger than the saturation current because of leakage currents that are proportional to the junction area. The reverse current increases with an increase in temperature, and increases somewhat with an increase in the reverse bias.

If the reverse conductance of the diodes is too low, then optional high-valued resistors may be included in parallel with these diodes to introduce a finite conductance and resistance for the reverse-biased diodes. Both the resistors and diodes are passive devices, and thus provide a passive signal path from the input node to the transistor gates. As will be described later, these diodes and resistors can be conveniently realized as part of the polysilicon gates of the transistors.

Figure 5:
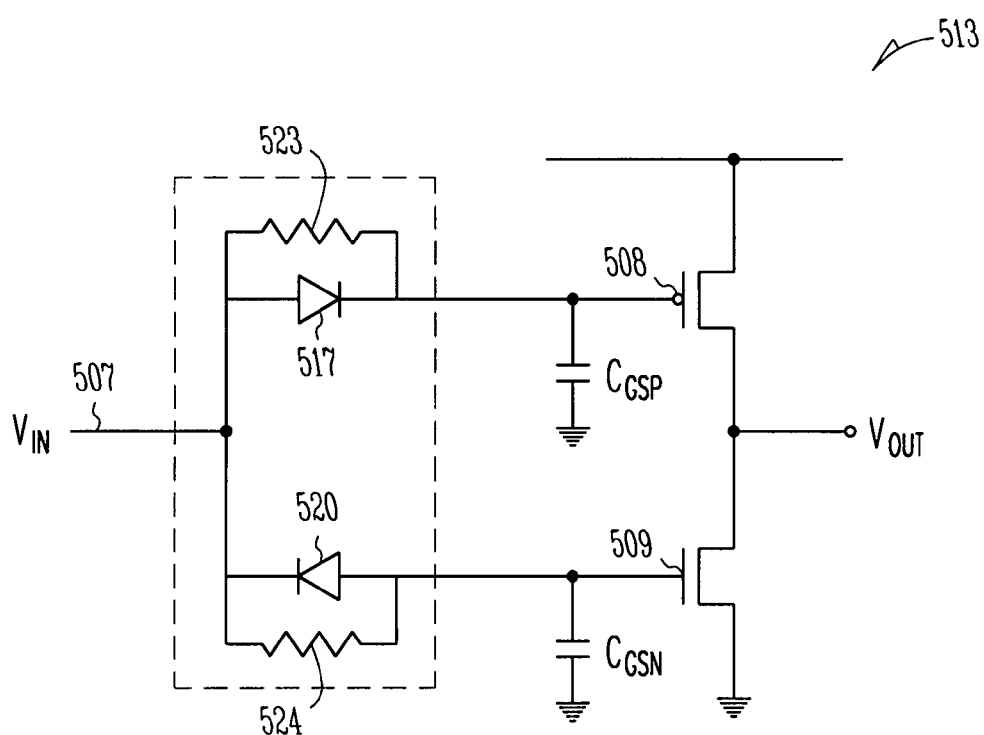
FIG. 5 illustrates a CMOS circuit with a diode and resistor connected in parallel between the inverter input node and the PMOS gate, and a diode and resistor connected in parallel between the inverter input node and NMOS gate, according to various embodiments.
Figure 6:
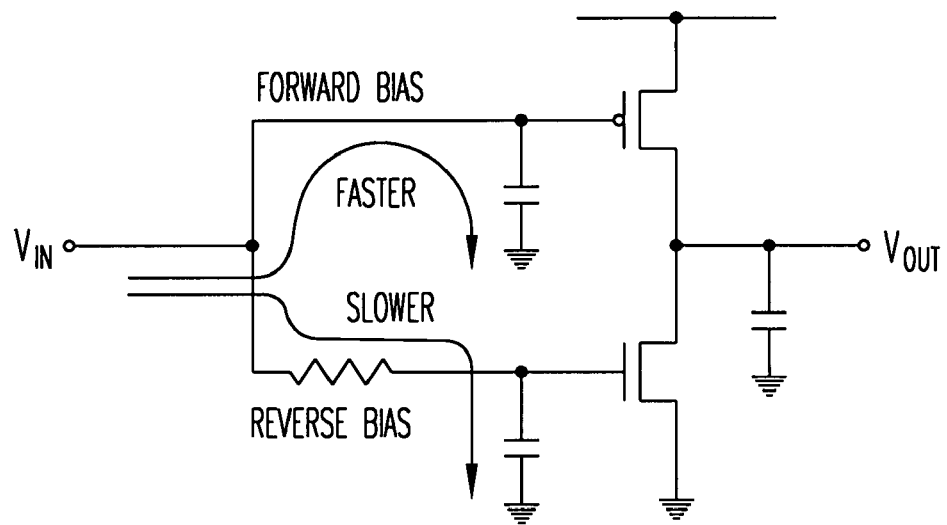
FIG. 6 illustrates current flow through the diodes on the rising edge of the input signal.

FIG. 5 illustrates a CMOS circuit 513 with a diode 517 and resistor 523 connected in parallel between the inverter input node 507 and the PMOS gate 508, and a diode 520 and resistor 524 connected in parallel between the inverter input node 507 and NMOS gate 509, according to various embodiments. The parallel high-value resistors reduce the equivalent resistance and increase the conductance for the conduction path between the inverter input and the transistor gates when the diode is reverse-biased, but do not significantly affect the low resistance and high conductance for the conduction path between the inverter input and the transistor gates when the diodes are forward-biased. Higher equivalent resistances when the diodes are reverse-biased slow the charging and discharging of the transistor gate nodes, which can correspond to reducing or even eliminating the crowbar current but also correspond to slower switching of the inverter output. Those of ordinary skill in the art will understand, upon reading and comprehending this disclosure, how to select a value for the parallel resistor to obtain a desired conductance when the diodes are reverse-biased to obtain an appropriate compromise to reduce or eliminate power loss from crowbar current and to maintain desired switching speed for the inverter output FIG. 6 illustrates current flow through the diodes on the rising edge of the input signal (INPUT$_R$). As illustrated, the conductance from the inverter input through the forward-biased diode to the gate of the PMOS transistor is faster than the conductance from the inverter input through the reverse-biased diode to the gate of the NMOS transistor. The forward-biased diode 317 illustrated in FIG. 3 (forward-biased diode 517 and parallel resistance 523 in some embodiments as illustrated in FIG. 5) has a small resistance which allows a large current to flow to quickly charge the gate of the PMOS to quickly turn off the PMOS transistor. This is illustrated in FIG. 3 by the slope of the rising edge PMOS$_R$ at the PMOS gate which closely corresponds to the slope of the rising edge INPUT$_R$ of the input signal. A small delay in the PMOS$_R$ is attributed to the barrier voltage of the forward-biased diode. The reverse-biased diode 320 illustrated in FIG. 3 (reverse-biased diode 520 and parallel resistor 524 in some embodiments as illustrated in FIG. 5) has a high resistance which limits the current flow to slow the charging of the gate of the NMOS to turn on the NMOS transistor more slowly. This is illustrated in FIG. 3 by the smaller slope of the rising edge NMOS$_R$ at the NMOS gate in comparison to the rising edge PMOS$_R$ at the PMOS gate.

Figure 7:
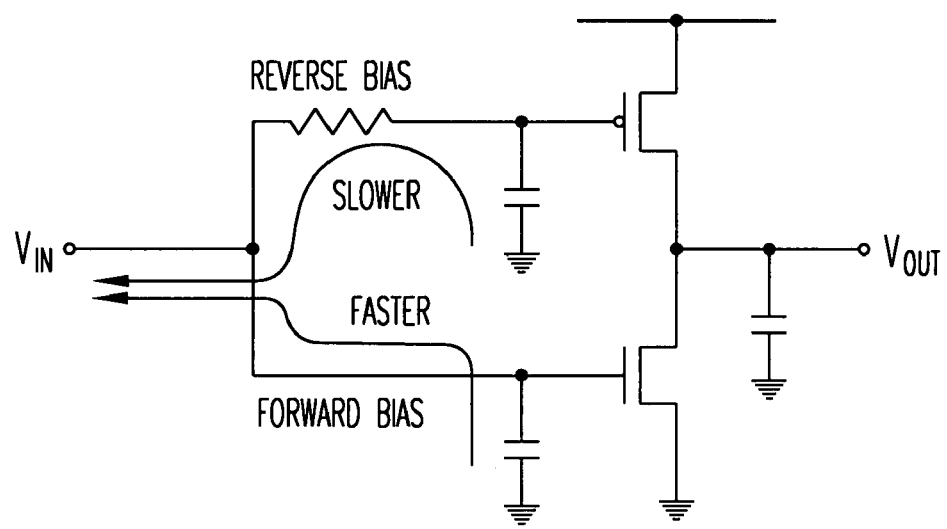
FIG. 7 illustrates current flow through the diodes on the falling edge of the input signal.

FIG. 7 illustrates current flow through the diodes on the falling edge of the input signal (INPUT$_F$). As illustrated, the conductance from the gate of the NMOS transistor through the forward-biased diode to the inverter input is faster than the conductance from the gate of the NMOS transistor through the reverse-biased diode to the inverter input. The forward-biased diode 320 illustrated in FIG. 3 (forward-biased diode 520 and parallel resistance 524 in some embodiments as illustrated in FIG. 5) has a small resistance that allows a large current to discharge the potential at the NMOS gate to quickly turn off the NMOS transistor. This is illustrated in FIG. 3 by the slope of the falling edge NMOS$_F$ at the NMOS gate which closely corresponds to the slope of the falling edge INPUT$_F$ of the input signal. A small delay in the NMOS$_F$ is attributed to the barrier voltage of the forward-biased diode. The reverse-biased diode 317 illustrated in FIG. 3 (reverse-biased diode 517 and parallel resistor 523 in some embodiments as illustrated in FIG. 5) has a small resistance which provides a small current flow to discharge the potential at the gate of the PMOS to turn on the PMOS transistor more slowly. This is illustrated in FIG. 3 by the smaller slope of the falling edge PMOS$_F$ at the PMOS gate in comparison to the falling edge NMOS$_F$ at the NMOS gate.

Circuit Simulations

Figure 8:
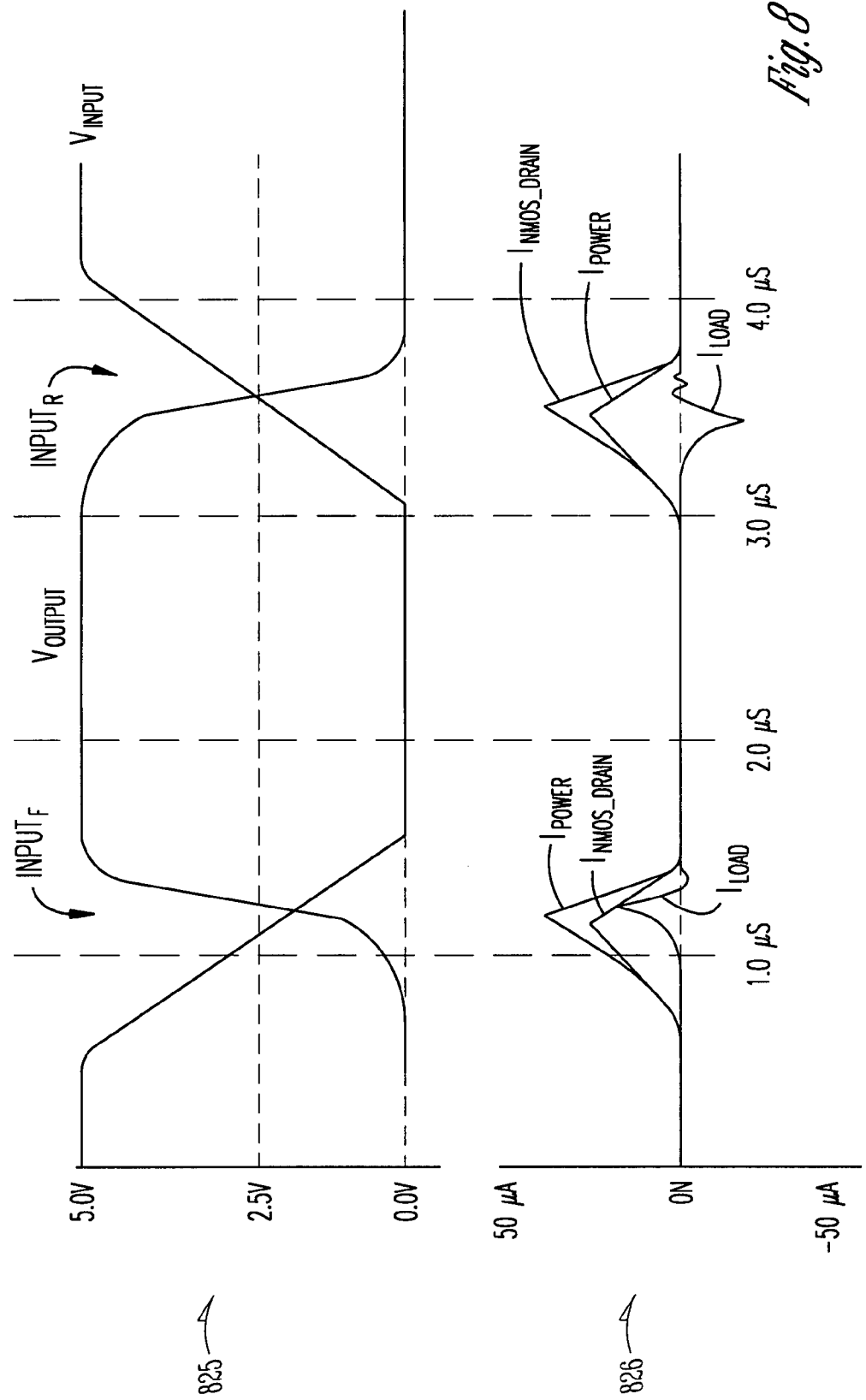
FIG. 8 illustrates results of a circuit simulation of a conventional CMOS inverter and driver, such as illustrated in FIG. 1A, with a large crowbar current.
Figure 9:
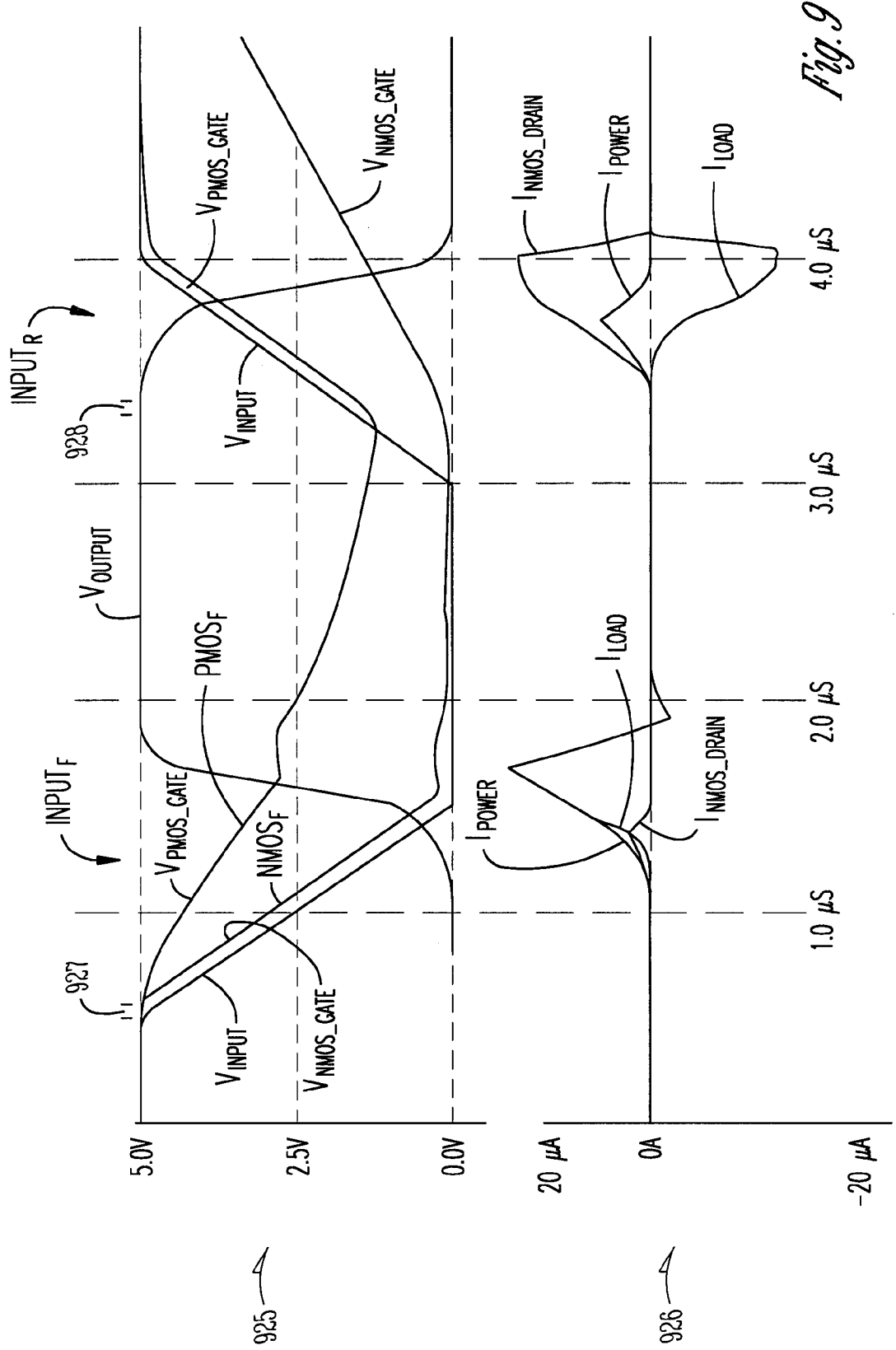
FIG. 9 illustrates a CMOS circuit including a CMOS inverter with diodes connected to the transistor gates according to embodiments of the present subject matter as illustrated in FIGS. 3 and 5.
Figure 10:
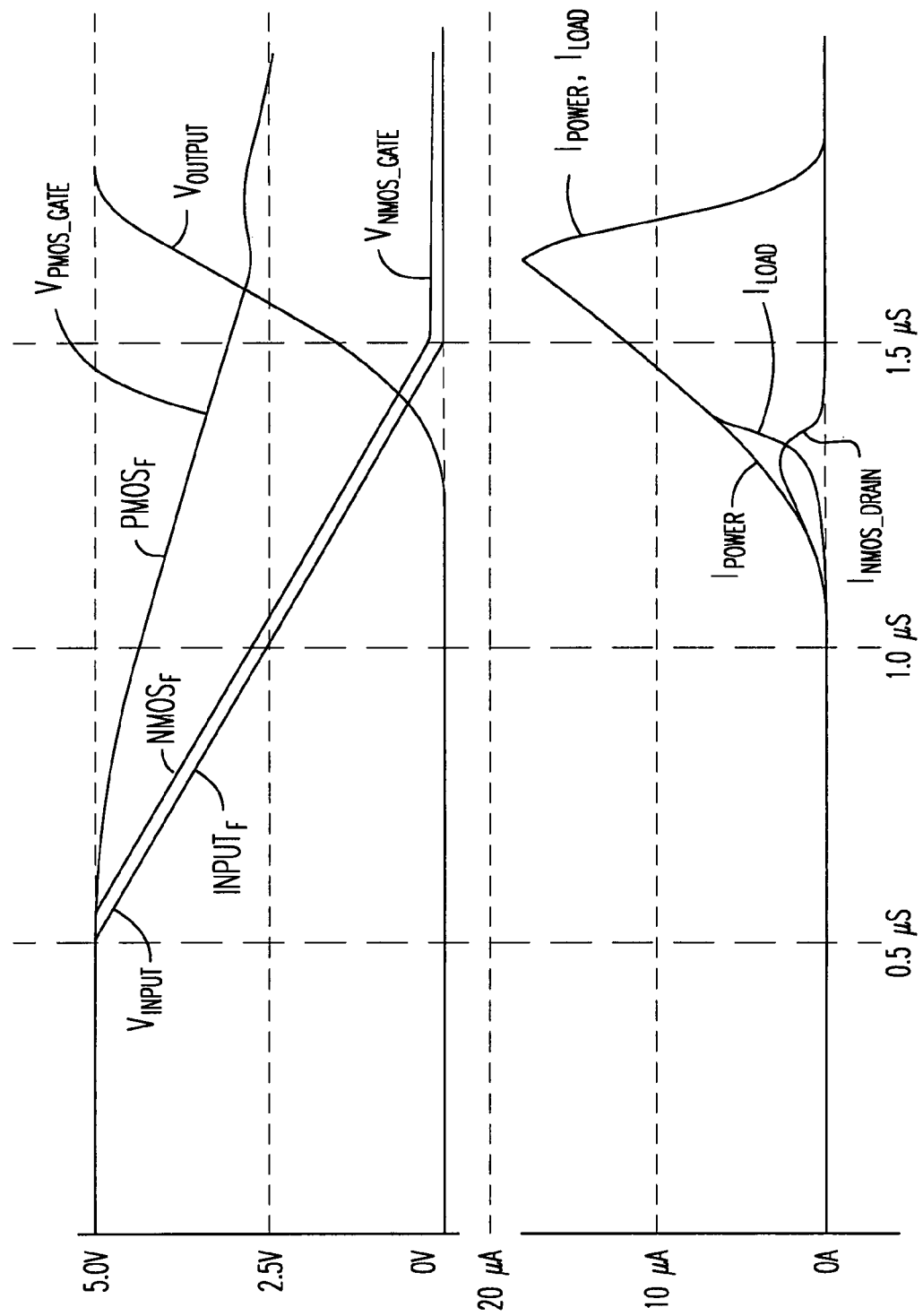
FIG. 10 gives a more detailed plot of the current waveforms on the falling edge of the input waveform.

FIGS. 8-10 illustrate results of circuit simulations to compare crowbar currents for conventional CMOS inverters and drivers with the crowbar currents for the CMOS circuits provided by the present subject matter. FIG. 8 illustrates results of a circuit simulation of a conventional CMOS inverter and driver, such as illustrated in FIG. 1A, with a large crowbar current. The figure includes a graphical representation of potentials 825 within the circuit and a corresponding graphical representation of currents 826 within the circuit. With reference to both FIG. 1A and FIG. 8, the representation of potentials 825 includes an input waveform V$_{INPUT}$ at the inverter input node 107 and an output waveform V$_{OUTPUT}$ at the inverter output node 112. The representation of currents 826 includes a power supply current I$_{POWER}$, an NMOS drain current I$_{NMOS\_DRAIN}$, and a current that charges/discharges the load capacitor (C$_{LOAD}$) I$_{LOAD}$. On the falling edge INPUT$_F$ of the input waveform V$_{INPUT}$, the PMOS transistor charges the load capacitor as illustrated by I$_{LOAD}$. However, most of the current from the power supply I$_{POWER}$ is not used to charge the load capacitor I$_{LOAD}$ but rather is wasted crowbar current through the NMOS transistor drain I$_{NMOS\_DRAIN}$. On the rising edge INPUT$_R$ of the input waveform V$_{INPUT}$ in an ideal CMOS driver, there would be no power supply current I$_{POWER}$ as the NMOS transistor drain current I$_{NMOS\_DRAIN}$ would simply discharge the load capacitor I$_{LOAD}$. However, as shown in FIG. 8, there is a large power supply current I$_{POWER}$ caused by a crowbar current. The NMOS drain current I$_{NMOS\_DRAIN}$ includes a sum of the crowbar current, represented here as I$_{POWER}$, and the current associated with the discharge from the load capacitor (C$_{LOAD}$) I$_{LOAD}$.

FIG. 9 illustrates a CMOS circuit including a CMOS inverter with diodes connected to the transistor gates according to embodiments of the present subject matter as illustrated in FIGS. 3 and 5. The figure includes a graphical representation of potentials 925 in the circuit and a corresponding graphical representation of currents 926 in the circuit. With reference to FIGS. 3, 5 and 9, the representation of potentials 925 includes an input waveform V$_{INPUT}$ at the inverter input node 307 and 507, an output waveform V$_{OUTPUT}$ at the inverter output node 312 and 512, the NMOS gate voltage V$_{NMOS\_GATE}$ at node 309 and 509, and the PMOS gate voltage V$_{PMOS\_GATE}$ at node 308 and 508. The representation of currents 926 includes a power supply current I$_{POWER}$, an NMOS drain current I$_{NMOS\_DRAIN}$, and a current that charges/discharges the load capacitor (C$_{LOAD}$) I$_{LOAD}$.

On the falling edge INPUT$_F$ of the input waveform V$_{INPUT}$, the NMOS turns off first because of the relatively fast conductance of the forward-biased diode, and the PMOS gate input is delayed because of the relatively slow conductance of the reverse-biased diode. The slope of the falling edge NMOS$_F$ of the NMOS gate voltage V$_{NMOS\_GATE}$ closely corresponds to the slope of the falling edge INPUT$_F$ of the input waveform V$_{INPUT}$. As represented at 927, the falling edge NMOS$_F$ of the NMOS gate voltage is delayed slightly with respect to the falling edge INPUT$_F$ of the input waveform, which reflects the short amount of time required for the input waveform to overcome the barrier voltage of the forward-biased diode. The magnitude of the slope for the falling edge PMOS$_F$ of the PMOS gate voltage V$_{PMOS\_GATE}$ is less than the magnitude of the slope for the falling edge NMOS$_F$ of the NMOS gate voltage because of the relatively slow conductance of the reverse-biased diode. Thus, in the illustrated simulation, the PMOS gate voltage does not turn on the PMOS transistor until the conductance of the NMOS transistor has been significantly reduced. This is reflected in the representation of currents. On the falling edge INPUT$_F$ of the input waveform, the PMOS transistor charges the load capacitor. Most of the power supply current I$_{POWER}$ is used to charge the load capacitor I$_{LOAD}$, with only a small amount of crowbar current wasted, as represented by the current through the NMOS transistor drain I$_{NMOS\_DRAIN}$. Thus, in this simulation, the conduction through the NMOS transistor was not completely terminated before the conduction through the PMOS transistor began. A comparison between the output waveforms of FIGS. 8 and 9 indicates that the output waveform V$_{OUTPUT}$ in FIG. 8 reached 2.5 V at about 1.2 μs, and the output waveform V$_{OUTPUT}$ in FIG. 9 reached 2.5 V at about 1.6 μs. Thus, delaying or slowing the falling edge of the PMOS gate voltage as illustrated in FIG. 9 significantly reduced crowbar current, and increased the inverter output transition by about 0.4 μs. FIG. 10 gives a more detailed plot of the current waveforms on the falling edge of the input waveform.

With reference to the rising edge $INPUT_R$ of the input waveform $V_{INPUT}$ illustrated in FIG. 9, the PMOS transistor turns off first, before the delayed NMOS gate voltage input rises. As a result the crowbar current is small because of the relatively fast conductance of the forward-biased diode, and the NMOS gate input is delayed because of the relatively slow conductance of the reverse-biased diode. The slope of the rising edge $PMOS_R$ of the PMOS gate voltage closely corresponds to the slope of the rising edge $INPUT_R$ of the input waveform. As represented at 928, the rising edge $PMOS_R$ of the PMOS gate voltage is delayed slightly with respect to the falling edge $INPUT_R$ of the input waveform, which reflects the short amount of time required for the input waveform to overcome the barrier voltage of the forward-biased diode. The magnitude of the slope for the rising edge $NMOS_R$ of the NMOS gate voltage is less than the magnitude of the slope for the rising edge $PMOS_R$ of the PMOS gate voltage because of the relatively slow conductance of the reverse-biased diode. Thus, in the illustrated simulation, the NMOS gate voltage does not turn on the NMOS transistor until the conductance of the PMOS transistor has been significantly reduced. On the rising edge $INPUT_R$ of the input waveform, the NMOS transistor discharges the load capacitor. Most of the NMOS drain current $I_{NMOS\_DRAIN}$ corresponds to the current used to discharge the load capacitor ($C_{LOAD}$) $I_{LOAD}$. The NMOS drain current $I_{NMOS\_DRAIN}$ also includes some current caused by the significantly reduced crowbar current, as illustrated by the power supply current $I_{POWER}$. Thus, in this simulation, the conduction through the PMOS transistor was not completely terminated before the conduction through the NMOS transistor began. A comparison between the output waveforms of FIGS. 8 and 9 indicates that the output waveform $V_{OUTPUT}$ in FIG. 8 reached 2.5 V at about 3.4 μs to 3.5 μs, and the output waveform $V_{OUTPUT}$ in FIG. 9 reached 2.5 V at about 3.9 μs. Thus, delaying or slowing the rising edge of the NMOS gate voltage as illustrated in FIG. 9 significantly reduced crowbar current, and increased the inverter output transition by about 0.4 to 0.5 μs.

Fabrication of Conduction Paths to Transistor Gates

The diodes and resistors can be incorporated into the polysilicon gates. Undoped or lightly doped polysilicon is highly resistive and can be used for resistors. Diodes in polysilicon are used for isolation in one-time programmable memories.

Planar Diode Fabrication

Figure 11A:
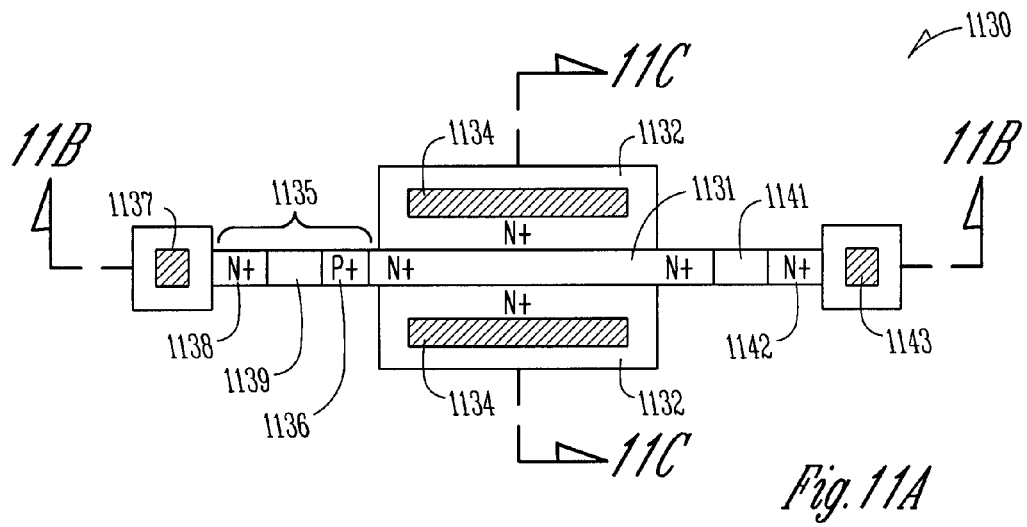
FIG. 11A illustrates a top view of a planar embodiment of an NMOS pull-down transistor for a CMOS inverter.
Figure 11B:
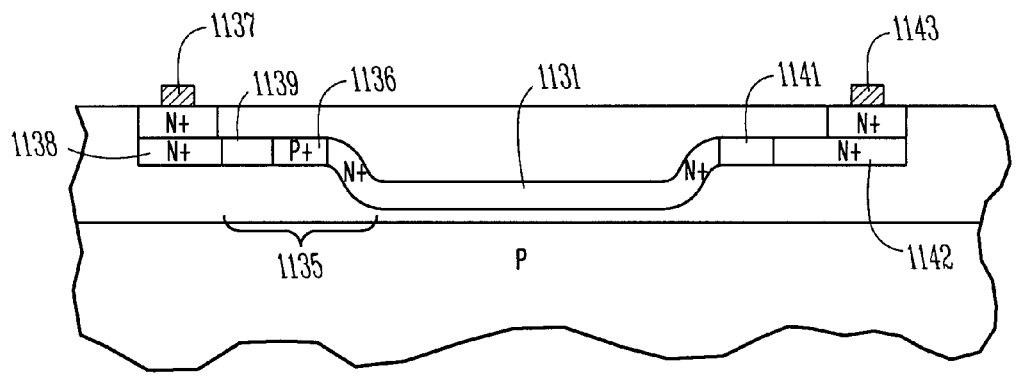
FIG. 11B illustrates a cross-section view taken along line 11B-11B of FIG. 11A.
Figure 11C:
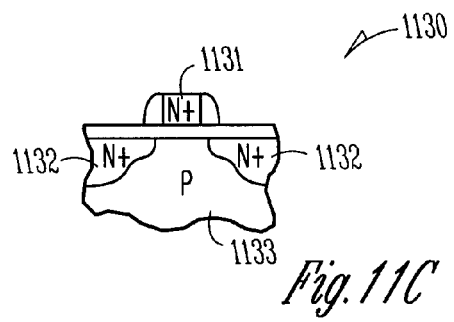
FIG. 11C illustrates a cross-section taken along FIG. 11C-11C of FIG. 11A.

FIG. 11A illustrates a top view of a planar embodiment of an NMOS pull-down transistor for a CMOS inverter, FIG. 11B illustrates a cross-section view taken along line 11B-11B of FIG. 11A, and FIG. 11C illustrates a cross-section taken along FIG. 11C-11C of FIG. 11A. The illustrated transistor 1130 includes an N+ doped polysilicon gate 1131, and N+ doped source/drain regions 1132 in a P-type substrate 1133, and further illustrates source/drain contacts 1134. The gate is separated from the substrate by a gate insulator. In the illustrated embodiment, a P+-I-N+ polysilicon diode 1135 is formed in a horizontal plane. The illustrated embodiment includes a P+ anode region 1136 formed in contact with the N+ polysilicon gate. A contact 1137 for the N+ cathode region 1138 is formed and is connected to an inverter input node. The P+ region 1136, in direct contact with the N+ gate 1131, will effectively form a short circuit because of the very heavily doped regions in close contact. An intrinsic semiconductor region 1139 is between the cathode and anode regions, in the illustrated embodiment.

As illustrated in FIG. 5, some embodiments include a high-value resistor 524 connected in parallel across the diode 520 between the inverter input node 507 and the NMOS transistor gate 509. For these embodiments, FIG. 11A illustrates a polysilicon resistor formed in a horizontal plane. The illustrated resistor comprises a resistive polysilicon region 1141 between the N+ polysilicon gate 1131 and another N+ region 1142. Some embodiments provide an undoped resistive region and some embodiments provide a lightly-doped resistive region to provide the desired equivalent resistance between the polysilicon gate and the inverter input when the P+-I-N+ diode is reverse-biased. A contact 1143 for the N+ region 1142 is formed and is connected to the inverter input node.

Figure 12A:
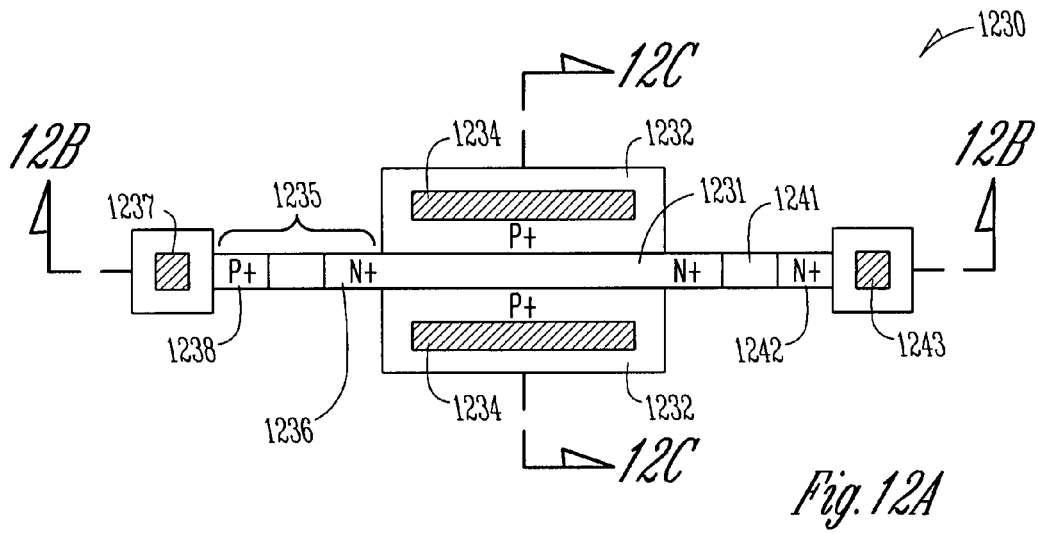
FIG. 12A illustrates a top view of a planar embodiment of a PMOS pull-up transistor for a CMOS inverter.
Figure 12B:
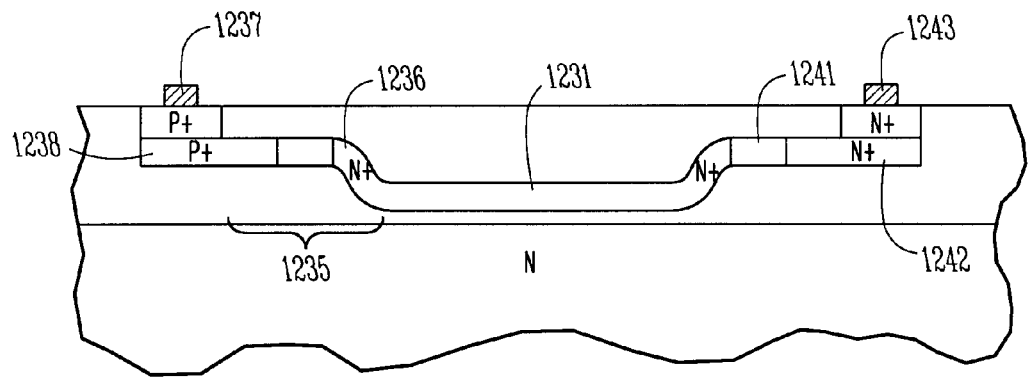
FIG. 12B illustrates a cross-section view taken along line 12B-12B of FIG. 12A.
Figure 12C:
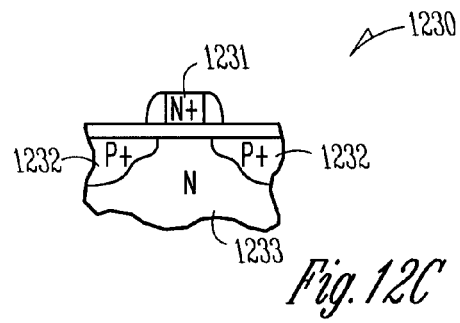
FIG. 12C illustrates a cross-section taken along FIG. 12C-12C of FIG. 12A.

FIG. 12A illustrates a top view of a planar embodiment of a PMOS pull-up transistor for a CMOS inverter, FIG. 12B illustrates a cross-section view taken along line 12B-12B of FIG. 12A, and FIG. 12C illustrates a cross-section taken along FIG. 12C-12C of FIG. 12A. The illustrated transistor 1230 includes a N+ doped polysilicon gate 1231, and P+ doped source/drain regions 1232 in an N-type substrate 1233, and further illustrates source/drain contacts 1234. The gate is separated from the substrate by a gate insulator. In the illustrated embodiment, a N+-I-P+ polysilicon diode 1235 is formed in a horizontal plane. The illustrated embodiment includes an N+ cathode region 1236 formed with the N+ polysilicon gate 1231. A contact 1237 for the P+ anode region 1238 is formed and is connected to an inverter input node.

As illustrated in FIG. 5, some embodiments include a high-value resistor 523 connected in parallel across the diode 517 between the inverter input node 507 and the PMOS transistor gate 508. For these embodiments, FIG. 12A also illustrates a polysilicon resistor formed in a horizontal plane. The illustrated resistor comprises a resistive polysilicon region 1241 between the N+ polysilicon gate 1231 and another N+ region 1242. Some embodiments provide an undoped resistive region and some embodiments provide a lightly-doped resistive region to provide the desired equivalent resistance between the polysilicon gate and the inverter input when the N+-I-P+ diode is reverse-biased. A contact 1243 for the N+ region 1242 is formed and is connected to the inverter input node.

Diode Fabrication in Via

Figure 13A:
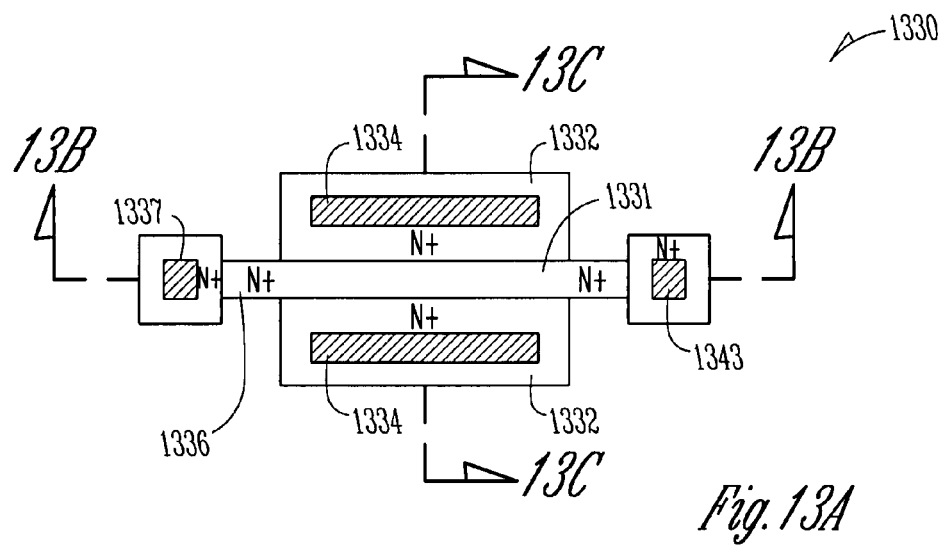
FIG. 13A illustrates a top view of an NMOS pull-down transistor for a CMOS inverter where a diode is fabricated in a via.
Figure 13B:
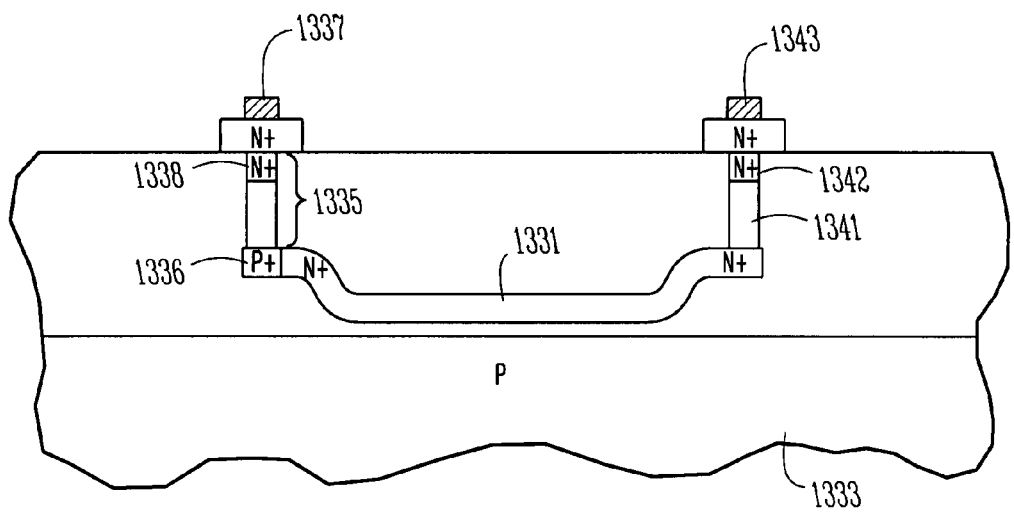
FIG. 13B illustrates a cross-section view taken along line 13B-13B of FIG. 13A.
Figure 13C:
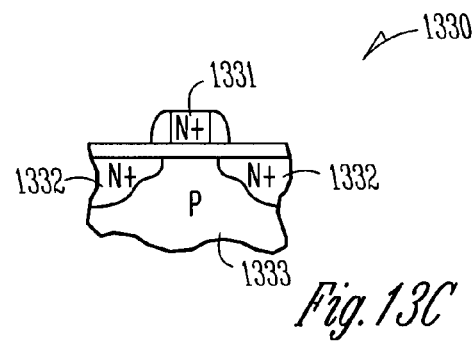
FIG. 13C illustrates a cross-section taken along FIG. 13C-13C of FIG. 13A.

FIG. 13A illustrates a top view of an NMOS pull-down transistor for a CMOS inverter where a diode is fabricated in a via, FIG. 13B illustrates a cross-section view taken along line 13B-13B of FIG. 13A, and FIG. 13C illustrates a cross-section taken along FIG. 13C-13C of FIG. 13A. The illustrated transistor 1330 includes an N+ doped polysilicon gate 1331, and N+ doped source/drain regions 1332 in a P-type substrate 1333, and further illustrates source/drain contacts 1334. The gate is separated from the substrate by a gate insulator. In the illustrated embodiment, a P+-I-N+ polysilicon diode 1335 is formed in a vertical orientation within a via. The illustrated embodiment includes a P+ anode region 1336 formed in contact with the N+ polysilicon gate 1331. The P+ region 1336, in direct contact with the N+ gate 1331, will form an effective short circuit because of the high dopings. A contact 1337 for the N+ cathode region 1338 is formed and is connected to an inverter input node.

As illustrated in FIG. 5, some embodiments include a high-value resistor 524 connected in parallel across the diode 520 between the inverter input node 507 and the NMOS transistor gate 509. For these embodiments, FIG. 13A illustrates a polysilicon resistor formed in an orientation within a via. The illustrated resistor comprises a resistive polysilicon region 1341 between the N+ polysilicon gate 1331 and another N+ region 1342. Some embodiments provide an undoped resistive region and some embodiments provide a lightly-doped resistive region to provide the desired equivalent resistance between the polysilicon gate and the inverter input when the P+-I-N+ diode is reversed biased. A contact 1343 for the N+ region 1342 is formed and is connected to the inverter input node.

Figure 14A:
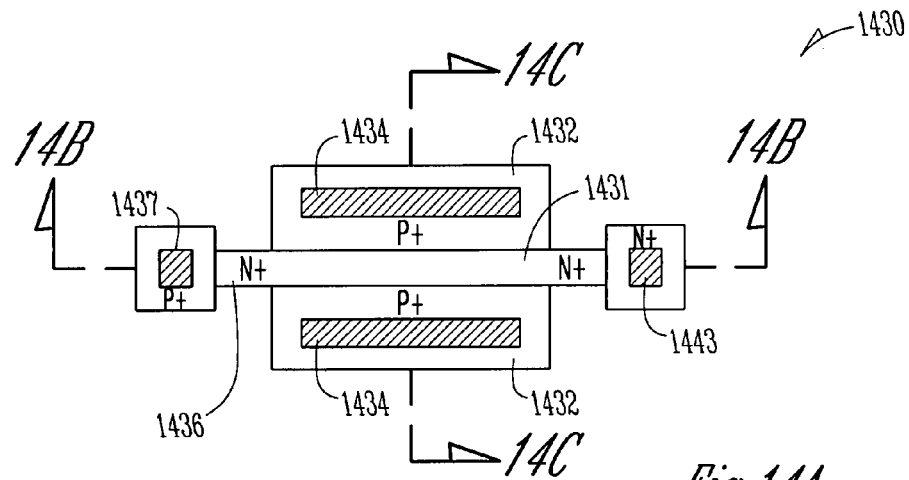
FIG. 14A illustrates a top view of a PMOS pull-up transistor for a CMOS inverter where a diode is fabricated in a via.
Figure 14B:
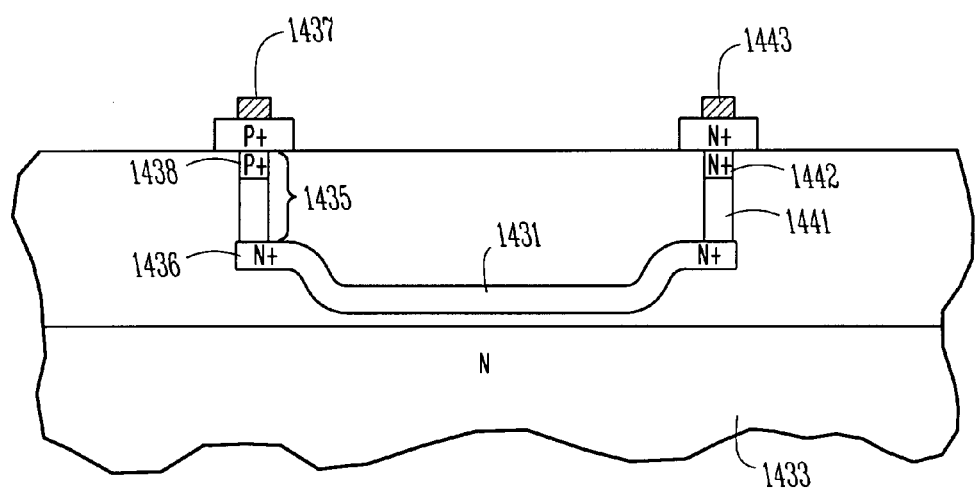
FIG. 14B illustrates a cross-section view taken along line 14B-14B of FIG. 14A.
Figure 14C:
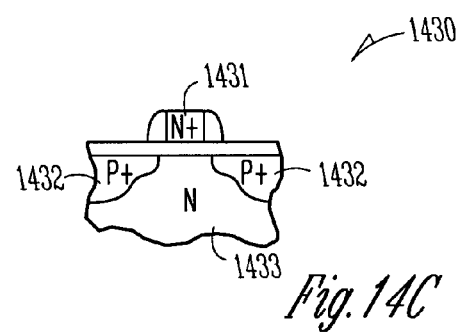
FIG. 14C illustrates a cross-section taken along FIG. 14C-14C of FIG. 14A.

FIG. 14A illustrates a top view of a PMOS pull-up transistor for a CMOS inverter where a diode is fabricated in a via, FIG. 14B illustrates a cross-section view taken along line 14B-14B of FIG. 14A, and FIG. 14C illustrates a cross-section taken along FIG. 14C-14C of FIG. 14A. The illustrated transistor 1430 includes a N+ doped polysilicon gate 1431, and P+ doped source/drain regions 1432 in an N-type substrate 1433, and further illustrates source/drain contacts 1434. The gate is separated from the substrate by a gate insulator. In the illustrated embodiment, a N+-I-P+ polysilicon diode 1435 is formed in a vertical orientation within a via. The illustrated embodiment includes an N+ cathode region 1436 formed with the N+ polysilicon gate 1431. A contact 1437 for the P+ anode region 1438 is formed and is connected to an inverter input node.

As illustrated in FIG. 5, some embodiments include a high-value resistor 523 connected in parallel across the diode 517 between the inverter input node 507 and the PMOS transistor gate 508. For these embodiments, FIG. 14A also illustrates a polysilicon resistor formed in a vertical orientation within a via. The illustrated resistor comprises a resistive polysilicon region 1441 between the N+ polysilicon gate 1431 and another N+ region 1442. Some embodiments provide an undoped resistive region and some embodiments provide a lightly-doped resistive region to provide the desired equivalent resistance between the polysilicon gate and the inverter input when the N+-I-P+ diode is reverse-biased. A contact 1443 for the N+ region 1442 is formed and is connected to the inverter input node.

Method of Operation

The methods illustrated in this disclosure are not intended to be exclusive of other methods within the scope of the present subject matter, and those of ordinary skill in the art will understand, upon reading and comprehending this disclosure, other methods within the scope of the present subject matter. The above-identified embodiments, and portions of the illustrated embodiments, are not necessarily mutually exclusive. These embodiments, or portions thereof, can be combined. For example, various embodiments combine circuits with CMOS inverters without the parallel resistances and circuits with CMOS inverters with the parallel resistances.

Figure 15:
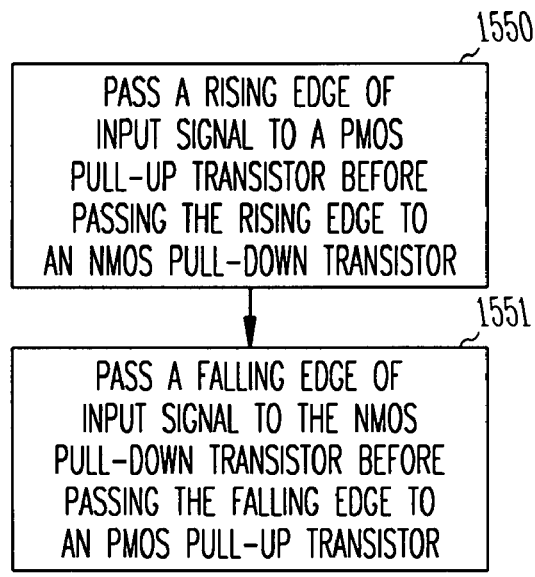
FIG. 15 illustrates a method for operating a CMOS inverter with a PMOS pull-up transistor and an NMOS pull-down transistor.

FIG. 15 illustrates a method for operating a CMOS inverter with a PMOS pull-up transistor and an NMOS pull-down transistor. As illustrated at 1550, a rising edge of an input signal is passed to the PMOS pull-up transistor before passing the rising edge to the NMOS pull-down transistor. The rising edge of the input signal will ultimately cause the inverter output to discharge through the NMOS pull-down transistor. The rising edge is processed to raise the PMOS gate voltage before raising the NMOS gate voltage, so as to initiate reduction of the conductive channel through the PMOS transistor before enhancing the conductive channel of the NMOS transistor. Thus, crowbar current from the power supply through the PMOS and NMOS transistors is reduced during the rising edge. Some embodiments pinch off the conductive channel of the PMOS transistor before providing the conductive channel of the NMOS transistor.

As illustrated at 1551, a falling edge of the input signal is passed to the NMOS pull-down transistor before passing the falling edge to the PMOS pull-up transistor. The falling edge of the input signal will ultimately cause the inverter output to charge through the PMOS pull-up transistor. The falling edge is processed to lower the NMOS gate voltage before lowering the PMOS gate voltage, so as to initiate reduction of the conductive channel through the NMOS transistor before enhancing the conductive channel of the PMOS transistor. Thus, crowbar current from the power supply through the PMOS and NMOS transistors is reduced during the falling edge. Some embodiments pinch off the conductive channel of the NMOS transistor before providing the conductive channel of the PMOS transistor.

In some illustrated embodiments, passing the signal edge to a first transistor before passing the signal edge to a second transistor of the CMOS inverter includes reducing current flow to or from the gate of the second transistor by increasing a resistance between an inverter input and the gate of the second transistor. The reduced current flow slows down the charging or discharging of the gate node, which effectively delays the transition of the second transistor from the non-conducting state to the conducting state and allows the first transistor to reduce the conduction channel to partially or completely transition from the conducting state to the non-conducting state before the second transistor begins to conduct.

Wafer and System Levels

The techniques disclosed here which delay the gate voltage input waveforms to the CMOS inverter and driver result in a large decrease in the DC crowbar current drawn from the power supply. Incorporation of these into clock drivers, interconnection drivers and output drivers will result in significantly lower power dissipation.

Figure 16:
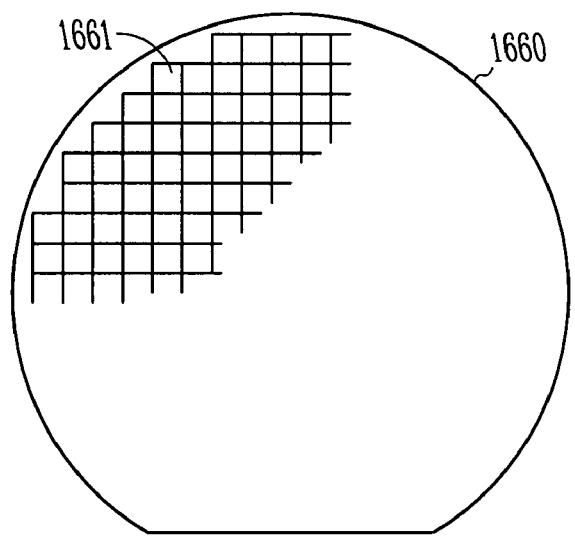
FIG. 16 illustrates a wafer 1660, upon which the CMOS inverter circuits with reduced or eliminated DC crowbar current can be fabricated according to embodiments of the present subject matter

FIG. 16 illustrates a wafer 1660, upon which the CMOS inverter circuits with reduced or eliminated DC crowbar current can be fabricated according to embodiments of the present subject matter. A common wafer size is 8 inches in diameter. However, wafers are capable of being fabricated in other sizes, and the present subject matter is not limited to wafers of a particular size. A number of dies can be formed on a wafer. A die 1661 is an individual pattern, typically rectangular, on a substrate that contains circuitry to perform a specific function. A semiconductor wafer typically contains a repeated pattern of such dies containing the same functionality. A die is typically packaged in a protective casing (not shown) with leads extending therefrom (not shown) providing access to the circuitry of the die for communication and control.

Figure 17:
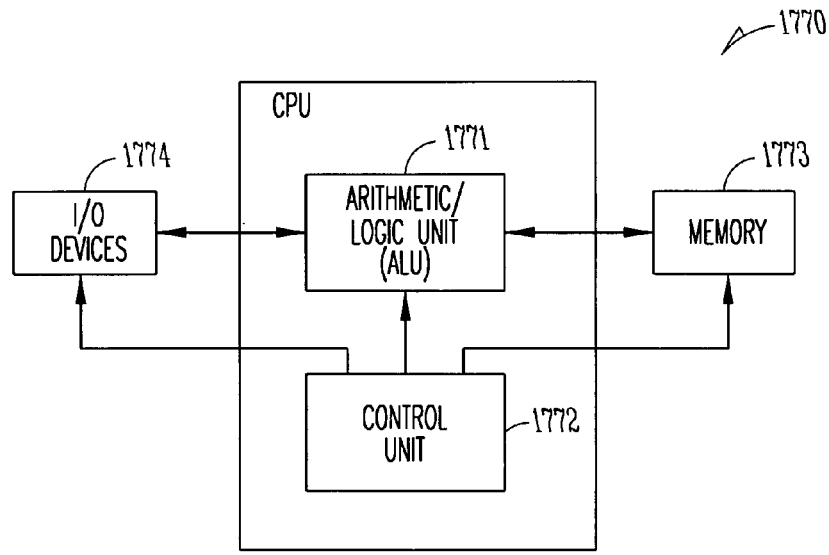
FIG. 17 illustrates a simplified block diagram of a high-level organization of an electronic system that includes CMOS inverter circuits with reduced or eliminated DC crowbar current, according to various embodiments.

FIG. 17 illustrates a simplified block diagram of a high-level organization of an electronic system that includes CMOS inverter circuits with reduced or eliminated DC crowbar current, according to various embodiments. In various embodiments, the system 1770 is a computer system, a process control system or other system that employs a processor and associated memory. The electronic system 1770 has functional elements, including a processor or arithmetic/logic unit (ALU) 1771, a control unit 1772, a memory device unit 1773 and an input/output (I/O) device 1774. Generally such an electronic system 1770 will have a native set of instructions that specify operations to be performed on data by the processor 1771 and other interactions between the processor 1771, the memory device unit 1773 and the I/O devices 1774. The control unit 1772 coordinates all operations of the processor 1771, the memory device 1773 and the I/O devices 1774 by continuously cycling through a set of operations that cause instructions to be fetched from the memory device 1773 and executed. According to various embodiments, the memory device 1773 includes, but is not limited to, random access memory (RAM) devices, read-only memory (ROM) devices, and peripheral devices such as a floppy disk drive and a compact disk CD-ROM drive. As one of ordinary skill in the art will understand upon reading and comprehending this disclosure, any of the illustrated electrical components are capable of being fabricated to include the CMOS inverter circuits with reduced or eliminated DC crowbar current in accordance with the present subject matter.

Figure 18:
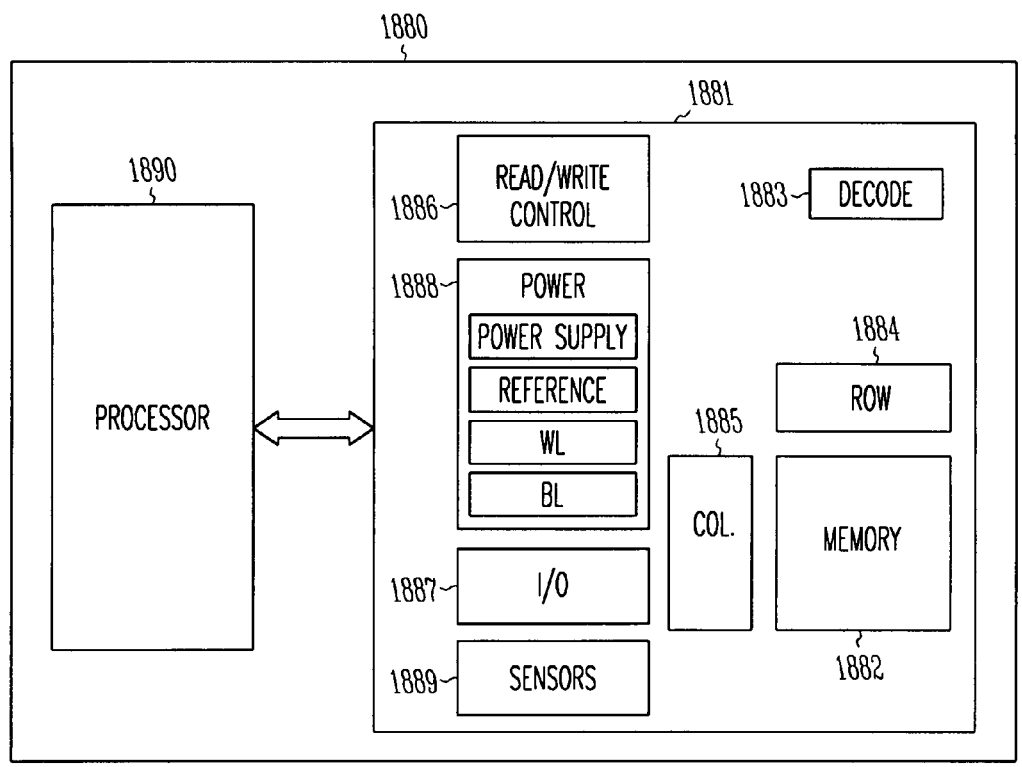
FIG. 18 illustrates a simplified block diagram of a high-level organization of an electronic system that CMOS inverter circuits with reduced or eliminated DC crowbar current, according to various embodiments.

FIG. 18 illustrates a simplified block diagram of a high-level organization of an electronic system that includes CMOS inverter circuits with reduced or eliminated DC crowbar current, according to various embodiments. The system 1880 includes a memory device 1881 which has an array of memory cells 1882, address decoder 1883, row access circuitry 1884, column access circuitry 1885, read/write control circuitry 1886 for controlling operations, and input/output circuitry 1887. The memory device 1881 further includes power circuitry 1888, and sensors 1889 for determining the state of the memory cells. The illustrated power circuitry 1888 includes power supply circuitry, circuitry for providing a reference voltage, circuitry for providing the word line with pulses, and circuitry for providing the bit line with pulses. Also, as shown in FIG. 18, the system 1880 includes a processor 1890, or memory controller for memory accessing. The memory device receives control signals from the processor over wiring or metallization lines. The memory device is used to store data which is accessed via I/O lines. It will be appreciated by those skilled in the art that additional circuitry and control signals can be provided, and that the memory device has been simplified. At least one of the processor or memory device includes the CMOS inverter circuits with reduced or eliminated DC crowbar current according to the present subject matter.

The illustration of system 1880 is intended to provide a general understanding of one application for the structure and circuitry of the present subject matter, and is not intended to serve as a complete description of all the elements and features of an electronic system. As one of ordinary skill in the art will understand, such an electronic system can be fabricated in single-package processing units, or even on a single semiconductor chip, in order to reduce the communication time between the processor and the memory device.

Applications containing CMOS inverter circuits with reduced or eliminated DC crowbar current, as described in this disclosure, include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

This disclosure includes several processes, circuit diagrams, and structures. The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A circuit, comprising:
   an input node to receive an input signal for a CMOS transistor stack;
   a first output node to deliver the input signal to a PMOS pull-up transistor of the CMOS transistor stack;
   a second output node to deliver the input signal to an NMOS pull-down transistor of the CMOS transistor stack;
   a first passive signal path between the input node and the first output node to pass an effective rising edge of the input signal and delay an effective falling edge of the input signal to a gate of the PMOS transistor; and
   a second passive signal path between the input node and the second output node to delay the effective rising edge of the input signal and pass the effective falling edge of the input signal to a gate of the NMOS transistor.

2. The circuit of claim 1, wherein each of the first and second passive signal paths includes a diode.

3. The circuit of claim 1, wherein each of the first and second passive signal paths includes a diode and a resistor connected in parallel across the diode.

4. The circuit of claim 1, wherein:
   the effective rising edge for the PMOS transistor includes a PMOS threshold voltage crossed to transition the PMOS transistor from a conducting transistor channel to a non-conducting transistor channel;
   the effective rising edge for the NMOS transistor includes an NMOS threshold voltage crossed to transition the NMOS transistor from a non-conducting transistor channel to a conducting transistor channel;
   the effective falling edge for the NMOS transistor includes the NMOS threshold voltage crossed to transition the NMOS transistor from the conducting transistor channel to the non-conducting transistor channel; and
   the effective falling edge for the PMOS transistor includes the PMOS threshold voltage crossed to transition the PMOS transistor from the non-conducting transistor channel to the conducting transistor channel.

5. The circuit of claim 1, wherein the first and second signal paths are adapted to slow a discharge rate of a PMOS gate in comparison to a discharge rate of an NMOS gate, and to slow a charge rate of the NMOS gate in comparison to a charge rate of the PMOS gate.

6. A circuit, comprising:
   an input node to receive an input signal for a CMOS transistor stack;
   a first output node to deliver the input signal to a gate of a PMOS pull-up transistor of the CMOS transistor stack, the PMOS transistor having a PMOS threshold voltage below which the PMOS transistor does not conduct and at which the PMOS transistor begins to conduct and continues to conduct at potentials greater than the PMOS threshold voltage;
   a first passive signal path between the input node and the first output node;
   a second output node to deliver the input signal to a gate of an NMOS pull-down transistor of the CMOS transistor stack, the NMOS transistor having an NMOS threshold voltage below which the NMOS transistor does not conduct and at which the NMOS transistor begins to conduct and continues to conduct at potentials greater than the NMOS threshold voltage;

a second passive signal path between the input node and the second output node;

the second passive signal path being adapted to delay the rising edge of the input signal from crossing the NMOS threshold voltage until after the PMOS threshold voltage is crossed; and the first passive signal path being adapted to delay the falling edge of the input signal from crossing the PMOS threshold voltage until after the NMOS threshold voltage is crossed.

7. The circuit of claim 6, wherein each of the first and second passive signal paths includes a diode.

8. The circuit of claim 6, wherein each of the first and second passive signal paths includes a diode and a resistor connected in parallel across the diode.

9. A circuit, comprising:
an input node to receive an input signal for a CMOS transistor stack;
a first output node to deliver the input signal to a gate of a PMOS pull-up transistor of the CMOS transistor stack;
a first signal path between the input node and the first output node;
a second output node to deliver the input signal to a gate of an NMOS pull-down transistor of the CMOS transistor stack;
a second signal path between the input node and the second output node;
the first signal path being adapted to charge the gate of the PMOS transistor to a logic high potential at a first charging rate and discharge the gate of the PMOS transistor to a logic low potential at a first discharging rate; and
the second signal path being adapted to charge the gate of the NMOS transistor to a logic high potential at a second charging rate slower than the first charging rate and to discharge the gate of the NMOS transistor to a logic low potential at a second discharging rate faster than the first discharging rate.

10. The circuit of claim 9, wherein each of the first and second signal paths includes a diode.

11. The circuit of claim 9, wherein each of the first and second signal paths includes a diode and a resistor connected in parallel across the diode.

12. A circuit, comprising:
an input node to receive an input signal for a CMOS transistor stack;
a first output node to deliver the input signal to a PMOS pull-up transistor of the CMOS transistor stack;
a second output node to deliver the input signal to an NMOS pull-down transistor of the CMOS transistor stack;
a first diode, including an anode connected to the input node and a cathode connected to a gate of the PMOS transistor; and
a second diode, including an anode connected to a gate of the NMOS transistor and a cathode connected to the input node.

13. The circuit of claim 12, further comprising a first resistor connected in parallel across the first diode and a second resistor connected in parallel across the second diode, wherein the first resistor has a value chosen to provide a desired conductance when the first diode is reverse-biased and the second resistor has a value chosen to provide a desired conductance when the second diode is reverse-biased.

14. A circuit, comprising:
a CMOS inverter, including:
a PMOS pull-up transistor, including a PMOS gate, a PMOS source connected to a first reference potential line and a PMOS drain connected to an inverter output node; and
an NMOS pull-down transistor, including an NMOS gate, an NMOS drain connected to the inverter output node, and an NMOS source connected to a second reference potential line;
a first passive signal path between an input node and the PMOS gate, the first passive signal path including a first diode having an anode connected to the input node and a cathode connected to a gate of the PMOS transistor; and
a second passive signal path between the input node and the NMOS gate, the second passive signal path including a second diode having an anode connected to a gate of the NMOS transistor and a cathode connected to the input node.

15. The circuit of claim 14, wherein the first passive signal path further includes a first resistor connected in parallel across the first diode, and the second passive signal path further includes a second resistor connected in parallel across the second diode, wherein the first resistor has a value chosen to provide a desired conductance when the first diode is reverse-biased and the second resistor has a value chosen to provide a desired conductance when the second diode is reverse-biased.

16. A device, comprising:
means for passing an effective rising edge of an input signal and delaying an effective falling edge of the input signal to a gate of a PMOS transistor through a first passive signal path extending from an input node to the gate of the PMOS transistor; and
means for delaying the effective rising edge of the input signal and passing the effective falling edge of the input signal to a gate of the NMOS transistor through a second passive signal path extending from the input node to the gate of the NMOS transistor.

17. The device of claim 16, wherein:
the means for passing an effective rising edge of an input signal and delaying an effective falling edge of the input signal to a gate of a PMOS transistor through a first passive signal path includes a first diode having an anode connected to the input node and a cathode connected to the gate of the PMOS transistor; and
the means for delaying the effective rising edge of the input signal and passing the effective falling edge of the input signal to a gate of the NMOS transistor through a second passive signal path includes a second diode having an anode connected to the gate of the NMOS transistor and a cathode connected to the input node.

18. A device, comprising:
means for charging a gate of a PMOS transistor to a logic high potential at a first charging rate and a gate of an NMOS transistor to a logic high potential at a second charging rate slower than the first charging rate; and
means for discharging the gate of the PMOS transistor to a logic low potential at a first discharging rate and the gate of the NMOS transistor to a logic low potential at a second discharging rate faster than the first discharging rate.

19. The device of claim 18, wherein:
the means for charging a gate of a PMOS transistor to a logic high potential at a first charging rate and a gate of an NMOS transistor to a logic high potential at a second charging rate slower than the first charging rate includes a forward-biased diode connected between an input node and the gate of the PMOS transistor and a reverse-biased diode connected between the input node and the gate of the NMOS transistor; and
the means for discharging the gate of the PMOS transistor to a logic low potential at a first discharging rate and the gate of the NMOS transistor to a logic low potential at a second discharging rate faster than the first discharging rate includes a forward-biased diode connected between the input node and the gate of the gate of the NMOS transistor and a reverse-biased diode connected between the input node and the gate of the PMOS transistor.

20. An integrated circuit structure, comprising:
a substrate;
a PMOS transistor on the substrate, the PMOS transistor including an n-type gate;
an NMOS transistor on the substrate, the NMOS transistor including an n-type gate;
a first diode with an n-type cathode integrated with the n-type gate of the PMOS transistor and a p-type anode electrically connected to an input node; and
a second diode with a p-type anode in contact with the n-type gate of the NMOS transistor and an n-type cathode electrically connected to the input node.

21. The structure of claim 20, wherein the first and second diodes include horizontally-oriented diodes.

22. The structure of claim 20, wherein the first and second diodes include vertically-oriented diodes.

23. The structure of claim 20, further comprising a first resistive polysilicon region electrically connecting the n-type gate of the PMOS transistor to the input node and a second resistive polysilicon region electrically connecting the n-type gate of the NMOS transistor to the input node.

24. The structure of claim 23, wherein the first and second diodes include horizontally-oriented diodes and the first and second resistive polysilicon regions include horizontally-oriented resistive polysilicon regions.

25. The structure of claim 23, wherein the first and second diodes include vertically-oriented diodes and the first and second resistive polysilicon regions include vertically-oriented resistive polysilicon regions.

26. A method, comprising:
forming an input node to receive an input signal for a CMOS transistor stack;
forming a first output node to deliver the input signal to a PMOS pull-up transistor of the CMOS transistor stack;
forming a second output node to deliver the input signal to an NMOS pull-down transistor of the CMOS transistor stack;
forming a first passive signal path between the input node and the first output node to pass an effective rising edge of the input signal and delay an effective falling edge of the input signal to a gate of the PMOS transistor; and
forming a second passive signal path between the input node and the second output node to delay the effective rising edge of the input signal and pass the effective falling edge of the input signal to a gate of the NMOS transistor.

27. The method of claim 26, wherein forming the first signal path includes forming a first diode and forming the second signal path includes forming a second diode.

28. The method of claim 26, wherein forming the first signal path includes forming a first diode and a first resistor in parallel across the first diode, and forming the second signal path includes forming a second diode and a second resistor in parallel across the second diode.

29. A method, comprising:
forming an input node to receive an input signal for a CMOS transistor stack;
forming a first output node to deliver the input signal to a PMOS pull-up transistor of the CMOS transistor stack;
forming a second output node to deliver the input signal to an NMOS pull-down transistor of the CMOS transistor stack;
forming a first diode, including forming an anode connected to the input node and a cathode connected to a gate of the PMOS transistor; and
forming a second diode, including forming an anode connected to a gate of the NMOS transistor and a cathode connected to the input node.

30. The method of claim 29, further comprising forming a first resistor in parallel across the first diode and forming a second resistor in parallel across the second diode.

31. A method for delivering a digital input signal to an inverter that includes a PMOS transistor and an NMOS transistor, the PMOS transistor having a PMOS gate and further having a conducting state and a non-conducting state, the NMOS transistor having an NMOS gate and further having a conducting state and a non-conducting state, the method comprising:
passing an effective rising edge of the digital input signal effective for changing the PMOS transistor from the conducting state to the non-conducting state to the PMOS gate, and delaying an effective falling edge of the digital input signal effective for changing the PMOS transistor from the non-conducting state to the conducting state to the PMOS gate; and
delaying the effective rising edge of the digital input signal effective for changing the NMOS transistor from the non-conducting state to the conducting state to the NMOS gate, and passing the effective falling edge of the digital input signal effective for changing the NMOS transistor from the conducting state to the non-conducting state to the NMOS gate.

32. The method of claim 31, wherein:
passing an effective rising edge includes conducting the rising edge through a forward-biased diode in a first signal path to the gate of the PMOS transistor;
delaying an effective falling edge includes conducting the falling edge through the first signal path with a reverse-biased diode;
delaying the effective rising edge includes conducting the rising edge through a second signal path with a reverse-biased diode; and
passing the effective falling edge includes conducting the falling edge through a forward-biased diode in the second signal path.

33. A method, comprising:
delaying a rising edge of a digital input signal from crossing an NMOS threshold voltage until after a PMOS threshold voltage is crossed; and
delaying a falling edge of the digital input signal from crossing the PMOS threshold voltage until after the NMOS threshold voltage is crossed.

34. The method of claim 33, wherein:

delaying a rising edge of a digital input signal from crossing the NMOS threshold voltage until after the PMOS threshold voltage is crossed includes charging a gate of the NMOS transistor at a charging rate slower than a rate for charging a gate of the PMOS transistor; and delaying a falling edge of the digital input signal from crossing the PMOS threshold voltage until after the NMOS threshold voltage is crossed includes discharging the gate of the PMOS at a discharging rate slower than a rate for discharging the gate of the NMOS transistor.

35. A method, comprising:

charging a gate of a PMOS transistor to a logic high potential at a first charging rate and a gate of an NMOS transistor to a logic high potential at a second charging rate slower than the first charging rate; and discharging the gate of the PMOS transistor to a logic low potential at a first discharging rate and the gate of the NMOS transistor to a logic low potential at a second discharging rate faster than the first discharging rate.

36. The method of claim 35, wherein:

charging includes charging the gate of the PMOS transistor through a forward-biased diode; and discharging includes discharging the gate of the NMOS transistor through a forward-biased diode.

37. A method, comprising:

in response to receiving a rising edge of a digital input signal at an input node for an inverter including a transistor stack with a PMOS pull-up transistor connected to an NMOS pull-down transistor, decreasing channel conductance through the PMOS pull-up transistor before increasing channel conductance through the NMOS pull-down transistor to pull a potential at an inverter output to a logic low potential; and in response to receiving a falling edge of the digital input signal at the inverter input, decreasing channel conductance through the NMOS pull-down transistor before increasing channel conductance through the PMOS pull-up transistor to pull the potential at the inverter output to a logic high potential.

38. The method of claim 37, wherein:

decreasing channel conductance through the PMOS pull-up transistor before increasing channel conductance through the NMOS pull-down transistor to pull a potential at an inverter output to a low potential includes charging a gate of the PMOS pull-up transistor to a logic high potential at a first charging rate and a gate of the NMOS pull-down transistor to a logic high potential at a second charging rate slower than the first charging rate; and decreasing channel conductance through the NMOS pull-down transistor before increasing channel conductance through the PMOS pull-up transistor to pull the potential at the inverter output to a logic high potential includes discharging the gate of the PMOS pull-up transistor to a logic low potential at a first discharging rate and the gate of the NMOS pull-down transistor to a logic low potential at a second discharging rate faster than the first discharging rate.

39. The method of claim 37, wherein:

decreasing channel conductance through the PMOS pull-up transistor includes charging a gate of the PMOS pull-up transistor through a forward-biased diode; and decreasing channel conductance through the NMOS pull-down transistor includes discharging a gate of the NMOS pull-down transistor through a forward-biased diode.

* * * * *